United States Patent [19]
Ohtani et al.

[11] Patent Number: 5,494,781
[45] Date of Patent: Feb. 27, 1996

[54] METHOD FOR MANUFACTURING PRINTED CIRCUIT BOARD

[75] Inventors: Ryuji Ohtani; Takeshi Okamoto; Yoshimitsu Nakamura; Yosiyuki Uchinono; Kazuo Kamada; Kunzi Nakashima; Toshiyuki Suzuki, all of Kadoma, Japan

[73] Assignee: Matsushita Electric Works, Ltd., Osaka, Japan

[21] Appl. No.: 286,324

[22] Filed: Aug. 4, 1994

[30] Foreign Application Priority Data

Aug. 26, 1993 [JP] Japan ................... 5-211941

[51] Int. Cl.⁶ ................................... G03F 7/26
[52] U.S. Cl. .................. 430/313; 430/311; 430/315; 430/318; 430/945
[58] Field of Search ................... 430/311, 313, 430/314, 315, 318, 396, 945

[56] References Cited

U.S. PATENT DOCUMENTS 5,338,645  8/1994  Henderson ................ 430/311

Primary Examiner—Kathleen Duda
Attorney, Agent, or Firm—Burns, Doane, Swecker & Mathis

[57] ABSTRACT

A method for manufacturing a printed circuit board is to form on a top surface of an insulating substrate a layer of such plating ground as a metal film, to irradiate such electromagetic wave as a laser to a boundary edge zone of non-circuit parts with respect to circuit-printing parts on the insulating substrate in correspondence to a pattern of the non-circuit parts to remove the plating ground layer at the part irradiate by the electromagnetic wave with the plating ground layer at the non-irradiated part left as formed, and thereafter to form a plating on the surface of the plating ground layer at the non-irradiated parts, whereby it is enabled to allow the laser irradiation to be carried out only with respect to the boundary edge zone of the non-circuit parts, without irradiating all over the non-circuit parts.

14 Claims, 17 Drawing Sheets

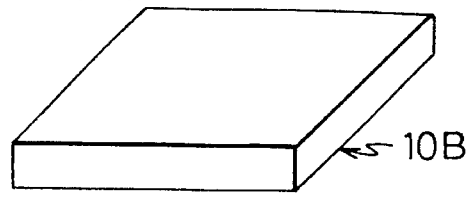
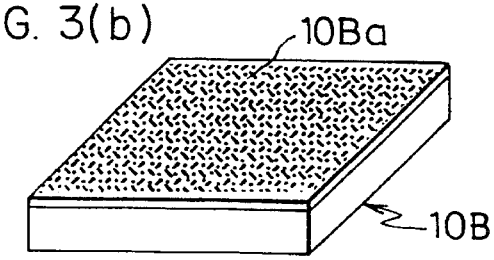
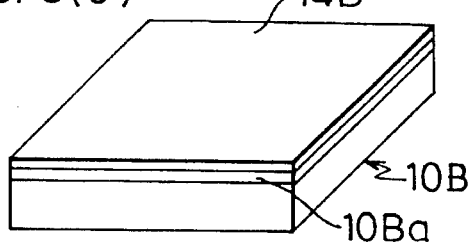
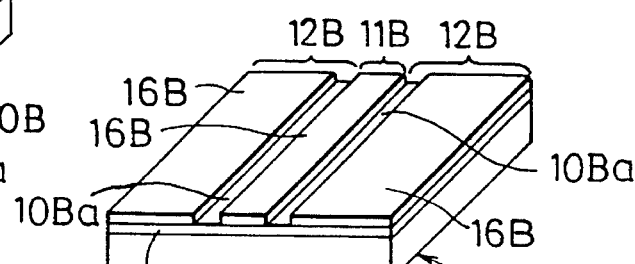
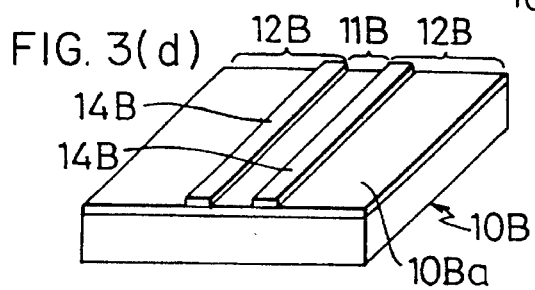
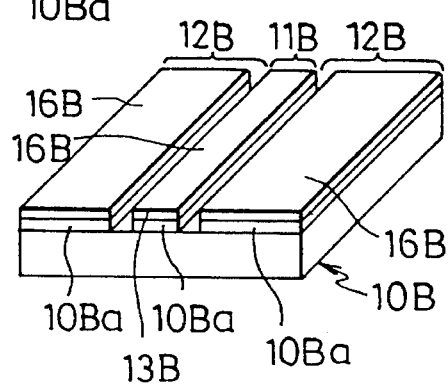
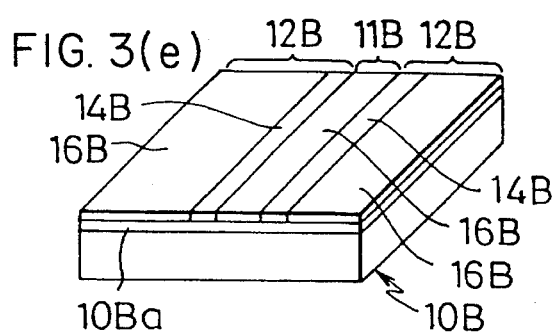

5,494,781

METHOD FOR MANUFACTURING PRINTED CIRCUIT BOARD

BACKGROUND OF THE INVENTION

This invention relates to a method for manufacturing a printed circuit board obtained by forming a circuit pattern on a surface or surfaces of planar or three dimensional cubiform insulating substrate.

DESCRIPTION OF RELATED ART

Prior art of manufacturing the printed circuit board by forming the circuit pattern on the surface of the insulating substrate in which a treatment is so made as not to form a plating at such non-circuit parts as insulating zones between respective elements of the circuit pattern by means of an irradiation of laser beam or the like and then the plating is performed for forming the circuit pattern, has been disclosed in Japanese Patent Laid-Open Publications Nos. 4-263490, 61-6892 and 3-122287.

In an invention described in Japanese Patent Laid-Open Publication No. 4-263490, more specifically, a plating conductor pattern is prepared by forming a thin conductor film on an insulating substrate, removing partly the thin conductor film by means of an irradiation of laser beam onto the film through a photo-mask having a circuit pattern, and building up a layer of the conductor on the circuit pattern of the thin conductor film remained by means of an electroless plating or electroplating.

According to Japanese Patent Laid-Open Publication No. 61-6892, further, a printed circuit is prepared by irradiating such high intensity beam as the laser beam in a pattern of the circuit onto a substrate provided on its surface with a layer of reactive catalyst for a chemical plating so as to cause the catalytic action of such layer to be lowered or to disappear at irradiated part, and selectively performing the chemical plating with respect to non-irradiated part.

In Japanese Patent Laid-Open Publication No. 3-122287, an invention described provides through a cladding a layer of catalyst on a substrate, activates the catalyst layer or renders the same to be in passive state by means of a regional irradiation of ultraviolet rays, and performs a plating or the like with respect to the activated region.

While in these three Japanese Patent Laid-Open Publications described above the inventions respectively manufacture the printed circuit board through the method comprising the step of irradiating the laser, ultraviolet or the like beam onto the non-circuit part on the insulating substrate, they show all to have the entire surface of the non-circuit parts irradiated by the laser, ultraviolet or the like beam. With such irradiation all over the wide non-circuit parts, there has been caused a problem that a long treating time is required for the irradiation of the laser, ultraviolet or the like beam so as to lower the productivity of the printed circuit board.

SUMMARY OF THE INVENTION

Accordingly, a primary object of the present invention is to eliminate the foregoing problem, and to provide a method for manufacturing the printed circuit board, which method is capable of shortening the required treatment time of irradiating the laser or the like electromagnetic wave.

According to the present invention, the above object can be realized by a method for manufacturing the printed circuit board, which method comprising the steps of forming on a surface of an insulating substrate a layer of plating ground of a metal film, irradiating such electromagnetic wave as a laser or the like onto a boundary edge zone of non-circuit part with respect to circuit-printing part on the insulating substrate to remove the plating ground layer at the part irradiated with the plating ground layer at non-irradiated part left as formed, and providing a plating on the plating ground layer at the non-irradiated part.

Other objects and advantages of the present invention shall become clear as description of the invention advances as detailed with reference to preferred embodiments of the invention shown in accompanying drawings.

BRIEF DESCRIPTION OF THE DRAWINGS

FIGS. 2(a)–2(f), 3(a)–3(g), 4(a)–4(d), 5(a)–5(c), 6(a)–6(e), and 7(a)–7(e), are explanatory views for the steps in other embodiments of the method according to the present invention;

While the present invention shall now be described with reference to the variety of embodiments shown in the accompanying drawings, it should be appreciated that the intention is not to limit the present invention only to these embodiments shown but rather to include all alterations, modifications and equivalent arrangements possible within the scope of appended claims.

DETAILED DESCRIPTION OF THE PREFERRED EMBODIMENTS

Figure 1A:
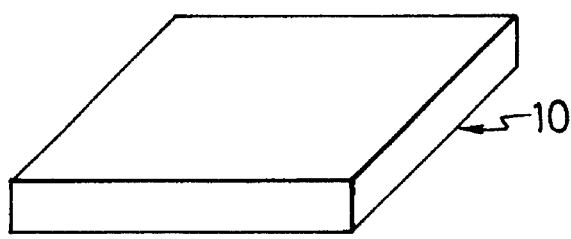
FIGS. 1(a)–1(e) and is an explanatory views for respective steps in an embodiment of the method for manufacturing the printed circuit board according to the present invention.

Referring to FIGS. 1(a)–1(e), there is shown an embodiment of the method according to the present invention, in which an insulating substrate 10 made of such electrically insulating material as polyimide, ABS, polyether imide, liquid crystal polymer, alumina ceramics or the like is employed. In FIG. 1(a), the substrate 10 is shown in a planar plate shape, while the substrate in any other three dimensional cubiform can be employed.

Figure 1B:
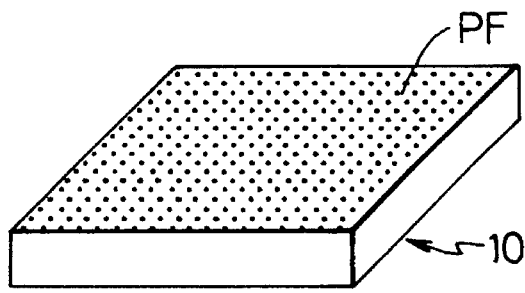

This insulating substrate 10 is subjected to a surface treatment with chromic acid solution, KOH aqueous solution, phosphoric acid solution or the like so as to have a roughened surface PF minutely undulated as indicated in FIG. 1(b).

Figure 1C:
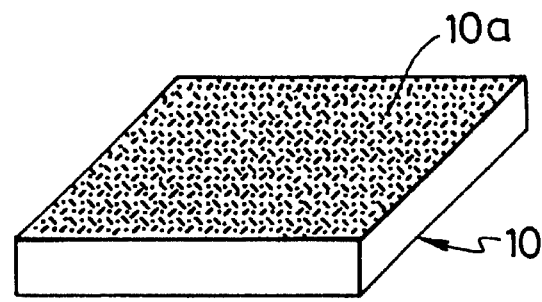

Next, a plating ground layer 10a is formed on the entire roughened surface PF of the insulating substrate 10, as indicated in FIG. 1(c). While this plating ground layer 10a may be formed by providing a metal film on the surface of the insulating substrate 10, the plating ground layer 10a in the embodiment of FIGS. 1(a)–1(e) is formed by dipping the substrate 10 in a solution containing palladium Pd acting as a catalyst in an electroless plating, thereafter subjecting the thus dipped substrate 10 to an activating treatment to nucleate its surface with Pd, and executing the electroless plating of Ni or Cu with respect to the activated surface of the substrate.

Figure 1D:
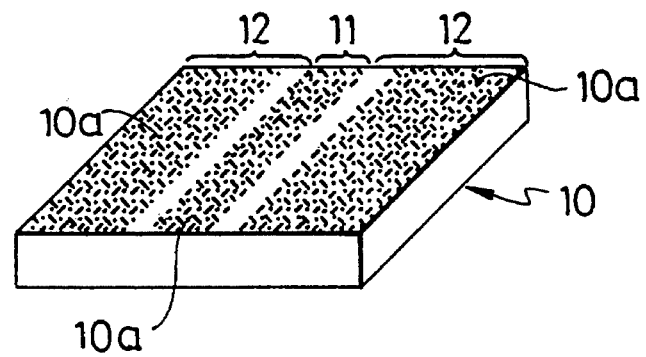
Figure 1E:
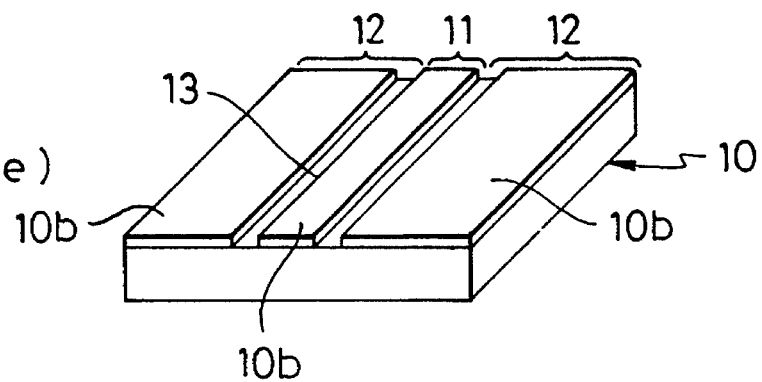

Then, such electromagnetic wave as a laser or the like is partly irradiated onto the thus treated surface of the insulating substrate 10 so as to remove the plating ground layer 10a at part irradiated. For the electromagnetic wave other than the laser, X-rays, ultraviolet rays or the like may be employed, but the laser is considered the optimum measure in these days, and following description shall be made with reference to the case where the laser is mainly employed as the electromagnetic wave. For this laser, it is possible to use, for example, Q switch YAG laser, which is arranged for the irradiation while moving the laser along the surface of the substrate 10 by operating the laser by means of a galvanomirror or the like. Here, the galvanomirror is one made variable in its angle by means of a galvanomirror employed, which allows the laser beam to be moved at a high speed and to be several ten μm in the spot diameter. Further, as shown in FIGS. 1(d) and 1(e), the laser irradiation is executed with respect to other parts than a circuit-printing part 11 on which a circuit element 13 is to be formed, among the treated surface of the insulating substrate 10, that is, with respect to non-circuit parts 12 which are to be insulating space on both sides of the circuit element 11 or between adjacent ones of the elements 11, while moving (scanning) the laser along a given pattern of the non-circuit parts 12 at a boundary edge zone of the non-circuit parts 12 with respect to the circuit-printing part 11, so that the plating ground layer 10a at the boundary edge zone of the non-circuit parts 12 with respect to the circuit-printing part 11 will be removed. Consequently, as seen in FIG. 1(d), in the plating ground layer 10a at the non-circuit parts 12, the layer 10a at the irradiated boundary edge zone with respect to the circuit-forming part 11 is removed, whereas the plating ground layer 10a of the non-circuit parts 12 at inner zone non-irradiated is to be left remained as spaced from the plating ground layer 10a at the circuit-printing part 11. Irradiation energy of the laser should preferably be in a range of 10 to 300 μJ/pulse, and the arrangement may be so made as to remove also surface portion of the insulating substrate 10 together with the plating ground layer 10a. Here, in an event where the width of the non-circuit parts 12 (that is, an isolating distance between the adjacent ones of the circuit-printing parts 11) is equivalent to the spot diameter ($\phi$100 μm, for example), it is possible to remove the plating ground layer 10a of the non-circuit parts 12, locating between such adjacent circuit-printing parts 11.

Further, after the irradiation of the laser to the boundary edge zone of the non-circuit parts 12 with respect to the circuit-printing parts 11 on the surface of the insulating substrate 10 as has been described, an electrolessly plated layer 10b of copper or the like is separated out in a thickness of about 10 μm on the plating ground layer 10a remained on the surface of the insulating substrate 10 non-irradiated by dipping the insulating substrate 10 in such electroless plating bath as an electroless copper plating solution or in any other similar manner. With the electrolessly plated layer 10b thus provided on the plating ground layer 10a, a pattern of the circuit element 13 can be formed. While the electrolessly plated layer 10b is to be also provided on the plating ground layer 10a remained at the inner zone of the non-circuit parts 12, the insulation properties of the circuit element 13 can be assured since the boundary edge zone of the plating ground layer 10a between the circuit-printing parts 11 and the non-circuit parts 12 has been removed through the laser irradiation, and no particular problem is caused to occur.

After the formation of the circuit pattern by means of the plating on the plating ground layer 10a of the circuit-printing parts 11, the printed circuit board can be completed by, as occasion demands, providing a solder resist, Ni plating, Au plating or the like (see FIG. 1(e)). In manufacturing the printed circuit board as has been described, the laser irradiation is to be executed only with respect to the boundary edge zone of the non-circuit parts 12, and the irradiation all over the non-circuit parts 12 through the laser scanning is not required, so that the required treatment time for the laser irradiation can be made shorter than in an event where the laser is to be irradiated through the scanning all over the wide range of the non-circuit parts 12, and it is enabled to elevate the productivity of the printed circuit board. While in the foregoing embodiment the electroless plating is to be carried out in forming the circuit with the plating applied after the laser irradiation, it is also possible to form the circuit with any other plating than the electroless plating optionally employed, such as electroplating, CVD (chemical vacuum deposition), PVD (physical vacuum deposition) or the like.

Figure 2A:
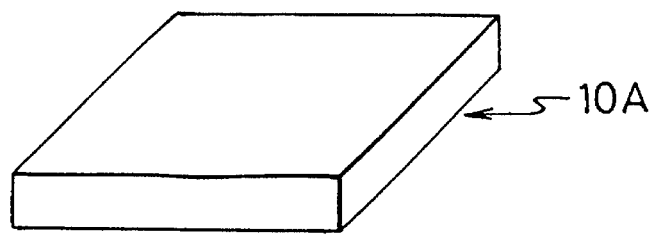
Figure 2B:
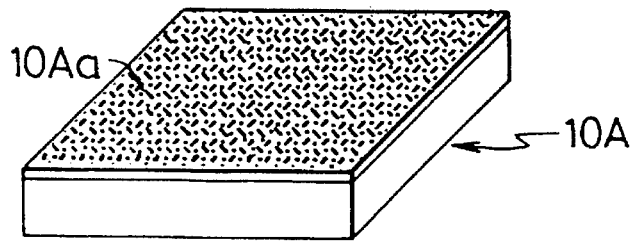
Figure 2C:
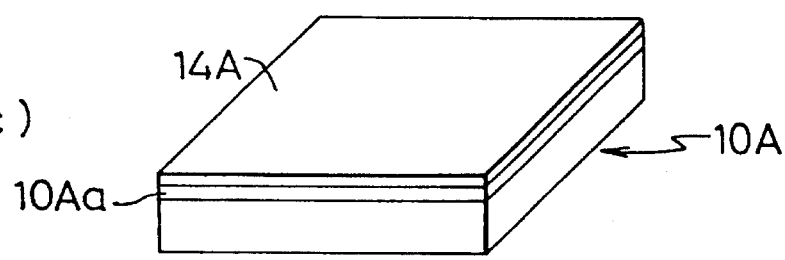
Figure 2D:
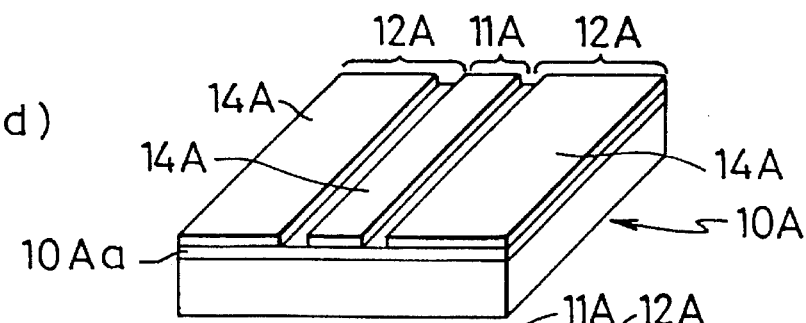
Figure 2E:
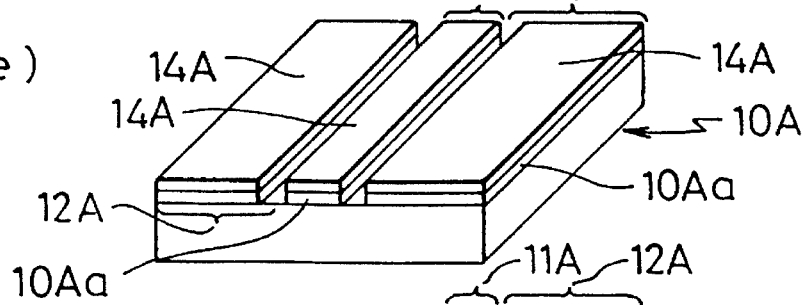

FIGS. 2(a)–2(f) shows, another embodiment of the present invention, in which the same insulating substrate 10A as that in the embodiment of FIGS. 1(a)–1(e) can be employed, while a three dimensional cubiform substrate other than such planar shaped glass-epoxy insulating substrate or the like as that shown in FIG. 2(a) may be employed. Initially, the insulating substrate 10A is subjected to the surface-roughening treatment, and thereafter the metal film 10Aa is provided on the entire surface of the insulating substrate 10A, as in FIG. 2(b). In this embodiment of FIGS. 2(a)–2(f) the metal film 10Aa is to be provided on the surface of the insulating substrate 10A by covering the substrate's surface with such metal foil as a copper foil of, for example, 18 μm thick. Next, the resist 14A is adhered as applied all over the surface of the metal film 10Aa, as in FIG. 2(c). For the resist 14A, an etching photo-resist which is made soluble to photographic developer as being exposed to light of such electromagnetic wave as the laser, or one which is removed as evaporated upon being irradiated by the laser or the like electromagnetic wave, may be employed, and in the embodiment of FIGS. 2(a)–2(f) the former photo-resist is to be employed.

The laser or the like electromagnetic wave is irradiated next in the manner similar to that in the embodiment of FIGS. 1(a)–1(e). For the laser, too, the Q switch YAG laser or the like may be employed, similar to the case of the embodiment of FIGS. 1(a)–1(e) and the laser is irradiated to the boundary edge zone of the non-circuit parts 12A with respect to the circuit-printing parts 11A on the surface of the insulating substrate 10A and along the pattern of the non-circuit parts 12A. The energy of irradiation of the laser should preferably be in a range of, for example, 10 to 30 mJ/cm². It is also preferable that the arrangement is so made that, in an event where the width of the non-circuit parts 12A is equalized to the spot diameter of the irradiated laser, the laser will be irradiated just once along the non-circuit parts 12A.

After the exposure to light of the resist as has been described in the above by means of the irradiation of the laser to the boundary edge region of the non-circuit parts 12A with respect to the circuit-printing parts 11A, the insulating substrate 10A is subjected to a development, to have part exposed to the light among the resist 14A to be dissolved by the developer to be thereby removed. Since the resist 14A is exposed to the light at the boundary edge region of the non-circuit parts 12A as irradiated by the laser, the resist 14A is removed at the boundary edge zone of the non-circuit parts 12 with respect to the circuit-printing parts 11A as in FIG. 2(d), and the metal film 10Aa at this zone is exposed. Next, through the surface treatment of the insulating substrate 10A with such etching solution as a hydrochloric acid solution of cupric chloride, the metal film 10Aa at the exposed parts without being covered by the resist 14A, that is, the metal film 10Aa at the boundary edge zone or the non-circuit parts 12A with respect to the circuit-printing parts 11A is dissolved and removed, as in FIG. 2(e). By subjecting the metal film 10Aa to the etching in this manner, the metal film 10Aa of the circuit-printing parts 11A is separated from the metal film 10Aa of the non-circuit parts 12A, and the circuit 13A in a pattern shape can be formed by the metal film 10Aa of the circuit-printing parts 11A.

Figure 2F:
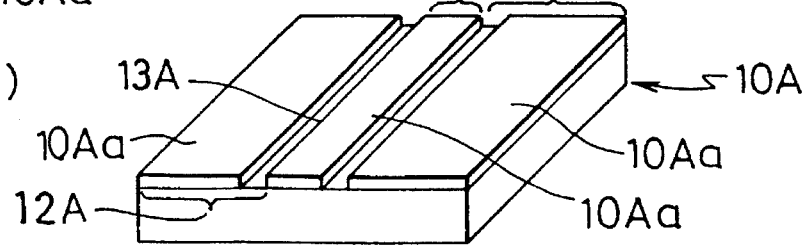

After the formation of the circuit 13A in this manner, the resist 14A left remained on both the circuit printing and non-circuit parts is removed as peeled off or the like manner, as seen in FIG. 2(f), and, if occasion further demands, the solder resist, Ni plating, Au plating or the like is to be provided, so as to have the printed circuit board can be completed.

While in the foregoings the photoresist made dissolvable to the photographic developer upon exposure to the light of such electromagnetic wave as the laser has been referred to as the resist, it is also possible to employ another resist which can be removed by the irradiation of laser, such as an urethane paint or the like. In this case, the irradiation energy of the laser should preferably be in the range of about 10 to 300 μJ/pulse, and the foregoing step of photographic developing is made unnecessary since the resist can be removed by the laser irradiation.

Since, in manufacturing the printed circuit board in the foregoing manner, the laser irradiation is to be performed only with respect to the boundary edge zone of the non-circuit parts 12A with respect to the circuit-printing parts 11A on the insulating substrate 10A and the scanning laser irradiation all over the surface of the non-circuit parts 12A is not required, the required time for the laser irradiation treatment can be also shortened as in the embodiment of FIGS. 1(a)–1(e), and the productivity of the printed circuit board can be effectively improved. Further, since the metal film 10Aa is to be removed through the etching and the irradiation of the laser or the like electromagnetic wave is only required for removing the resist 14A, the manufacture of the printed circuit board can be realized by means of a laser of relatively low intensity as the electromagnetic wave.

FIGS. 3(a)–3(g) shows still another embodiment of the present invention, in which the insulating substrate 10B which may be the same as that in the embodiment of FIGS. 1(a)–1(e) is shown to be one formed into such planar shape as in FIG. 3(a) of polyimide film or the like, while any other one formed in a three dimensional cubiform may also be employed. Next, as in FIG. 3(b), such thin metal film 10Ba of copper or the like and about 1 mm thick is provided on the entire surface of the insulating substrate 10B, by means of the electroless plating, vacuum metallizing, sputtering or the like process. Next, the resist 14B is applied and adhered to the whole surface of the metal film 10Ba, as in FIG. 3(c). For this resist 14B, it is optimum to employ a photo resist of the type which is made insoluble to the photographic developer when exposed to light of the irradiated laser or the like electromagnetic wave.

Next, the laser or the like electromagnetic wave is irradiated in similar manner to the embodiment of FIGS. 1(a)–1(e). For the laser, the Q switch YAG laser may be employed in common to the embodiment of FIGS. 1(a)–1(e), and the laser is irradiated onto the boundary edge zone of the non-circuit parts 12B with respect to the circuit-printing parts 11B along the pattern of the non-circuit parts 12B, by operating the laser through the galvanomirror or the like employing the galvanometer. The irradiation energy of the laser should preferably be in the range of about 10 to 30 mJ/cm², for example. Further, when the width of the non-circuit part 12B is equalized to the spot diameter of the laser, it is preferable that the laser is irradiated once along the non-circuit part 12B.

After exposing the resist 14B to the light with the laser irradiated to the boundary edge zone of the non-circuit parts 12B with respect to the circuit-printing parts 11B on the insulating substrate 10B, the resist 14B is subjected to the development. The resist 14B at its parts where exposed to the light is insoluble to the developer but the resist 14B at other parts where not exposed to light is dissolved into the developer so that, as in FIG. 3(d), the resist 14B at the boundary edge zone of the non-circuit parts 12B with respect to the circuit-printing part 11B and exposed to the laser light are caused to remain, while the resist 14B at the non-irradiated parts is removed, and the metal film 10Ba is exposed at such non-irradiated parts. Next, the plating is made with respect to the thus exposed parts of the metal film 10Ba. This plating may be the electroplating, in which the insulating substrate 10B is dipped in an electroplating bath while feeding a current to the metal film 10Ba connected to a negative pole of power feeding electrodes, and a copper or the like electro-plated metal layer 16B is separated out at a thickness of about 10 μm on the exposed surface of the metal film 10Ba as shown in FIG. 3(e). Thereafter, the still remained resist 14B at the parts exposed to the light is peeled off and, as shown in FIG. 3(f), the metal film 10Ba is exposed at the parts where the resist 14B is peeled off. Since the resist 14B here remained has been at the boundary edge zone of the non-circuit parts 12B with respect to the circuit-printing parts 11B, the metal foil 10Ba is to be exposed at such boundary edge zone. Further, by executing lightly the etching treatment to be about 1 μm thick with the etching solution of the hydrochloric acid solution of cupric chloride, the exposed parts of the thin metal film 10Ba, that is, the metal film 10Ba at the boundary edge zone of the non-circuit parts 12B with respect to the circuit-printing parts 11B is dissolved and removed. By such separation of the metal film 10Ba at the circuit-printing parts 11B from the metal film 10Ba at the non-circuit parts 12B through the etching with respect to the metal film 10Ba, the circuit elements 13B of the pattern shape can be formed with the metal film 10Ba and electro-plated layer 16B at the circuit-printing parts 11B.

After the formation of the pattern of the circuit elements 13B as described in the above, the solder resist, Ni plating, Au plating or the like is applied as occasion demands, and the printed circuit board can be finished. Since, in manufacturing the printed circuit board as has been described, the laser irradiation is carried out only with respect to the boundary edge zone of the non-circuit parts 12B least with respect to the circuit-printing parts 11B on the surface of the insulating substrate 10B and no scanning irradiation of the laser over the whole surface of the non-circuit parts 12B is required, it is enabled to shorten the treating time of the laser irradiation and to elevate the productivity of the printed circuit board, similarly to the embodiment of FIGS 1(a)–1(e). Further, while the removal of the metal film 10Ba here has been referred to as being performed through the etching, it is possible to utilize the laser of a relatively low intensity but enough for attaining the light exposure of the resist 14B by the irradiation of the laser or the like electromagnetic wave, without any risk of damaging the insulating substrate 10B by the laser irradiation, and the manufacturing ability of the printed circuit board can be remarkably improved.

Figure 4A:
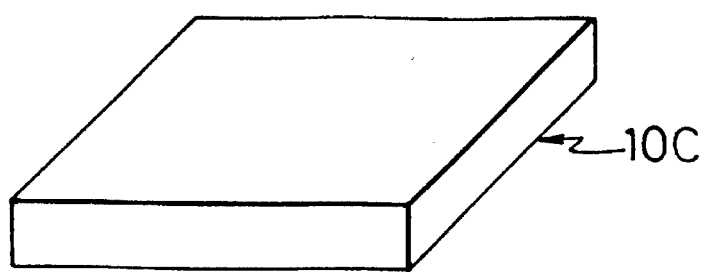
Figure 4B:
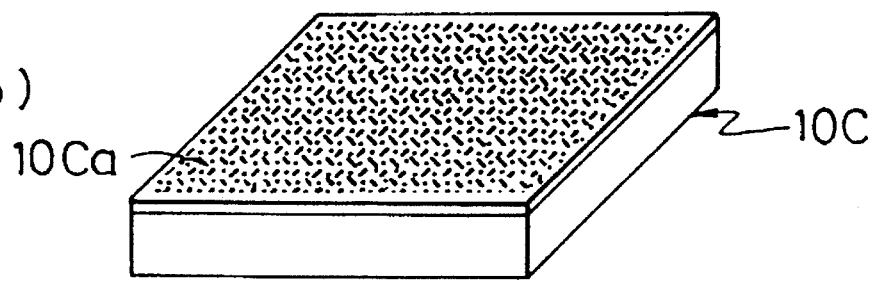

FIGS. 4(a)–4(d) shows another embodiment of the present invention, in which the same insulating substrate 10C as that in the embodiment of FIGS. 1(a)–1(e) of such planar shape as in FIG. 4(a) can be employed, while any one prepared in a three dimensional cubiform may be employed. In this case, the surface of the insulating substrate 10C is subjected to the surface roughening treatment for providing thereto minute unduration through a plasma treatment and, thereafter, the thin metal film 10Ca is provided on all over the surface of the insulating substrate 10C as the plating ground layer, as in FIG. 4(b). The metal film 10Ca can be formed in any optional manner such as the electroless plating carried out after providing catalyst on the surface of the insulating substrate 10C, the CVD, such PVD as the sputtering or the like, and so on. In the embodiment of FIGS. 4(a)–4(d), the sputtering is employed, so that the thin metal film 10Ca about 0.1 to 2 μm thick is formed with Cu, Ni, Pd, Cr, Ag or the like.

Figure 4C:
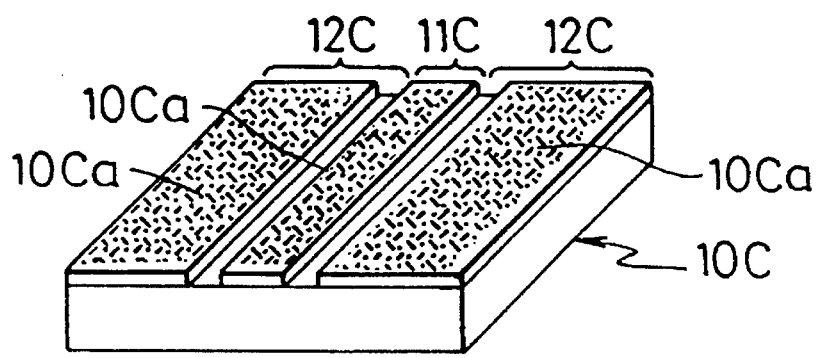
Figure 4D:
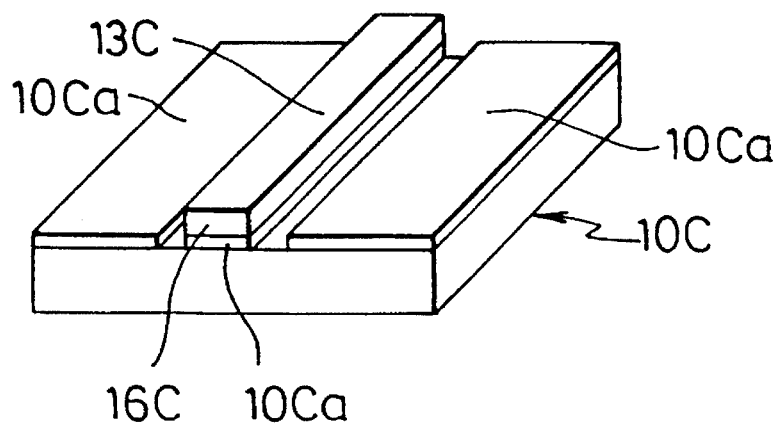

In this case, the laser or the like electromagnetic wave is irradiated in the same manner as in the embodiment of FIGS. 1(a)–1(e), and the thin metal film 10Ca is removed at the part where the laser is irradiated. For the laser, the Q switch YAG laser or the like may be employed similarly to the embodiment of FIGS. 1(a)–1(e), so that the laser is made to be irradiated onto the boundary edge zone of the non-circuit parts 12C with respect to the circuit-plating parts 11C while being moved along the surface of the insulating substrate 10C by the operation of the galvanomirror or the like formed with the galvanometer. Accordingly, as shown in FIG. 4(c), the metal film 10Ca at boundary edge portion of the non-circuit parts 12C with respect to the circuit-printing parts 11C and where the laser has been irradiated is removed, whereas the metal film 10Ca also at the non-circuit parts 12C but where the laser has not been irradiated is maintained without being removed, together with the metal film 10Ca at the circuit-printing parts 11C. The irradiation energy of the laser should preferably be in a range, for example, of about 10 to 300 μJ/pulse, and the arrangement may be so made as to remove a surface portion of the insulating substrate 10C simultaneously with the metal film 10Ca. Also, similarly to the embodiment of FIGS. 1(a)–1(e), it is preferable that, in the event where the width of the non-circuit part 12C is equal to the spot diameter of the irradiating laser, the laser is irradiated just once along the non-circuit parts 12C.

After the laser irradiation onto the boundary edge zone of the non-circuit parts 12C with respect to the circuit-printing parts 11C on the insulating substrate 10C as referred to in the above, the insulating substrate 10C is immersed in the electroplating bath, while feeding the current to the metal film 10Ca at the circuit-printing parts 11C through the negative side of the feeding electrodes connected to the particular metal film, whereby the electro-plated layer 16C of copper or the like is separated out at a thickness of about 10 μm on the metal film 10Ca at the circuit-printing parts 11C, and the circuit elements 13C in the pattern shape can be formed. Since no current is fed to the metal film 10Ca remained at the non-circuit parts 12C, no electro-plated layer 16C is provided on the thus remained metal film 10Ca at the non-circuit parts 12C.

After the formation of the circuit by means of the electroplating performed on the metal film 10Ca at the circuit-printing parts 11C, the printed circuit board can be finished by applying, as occasion demands, the solder resist, Ni plating, Au plating or the like. Since, in manufacturing the printed circuit board as has been described, the laser irradiation is to be performed only along the boundary edge line of the non-circuit parts 12C with respect to the circuit-printing parts 11C on the surface of the insulating substrate 10C and any scanning irradiation of the laser all over the entire surface of the non-circuit parts 12C is not required, it is enabled to shorten the required treating time for the laser irradiation similarly to the embodiment of FIGS. 1(a)–1(e) and to elevate effectively the productivity of the printed circuit board. Further, as the plating for forming the circuit is to be performed only at the required circuit-printing parts 11C for forming the circuit elements 13C and not performed at the non-circuit parts 12C not requiring, any wasting part of such material for the plating as plating metal or the like can be reduced to be advantageous also in the economy.

Figure 5A:
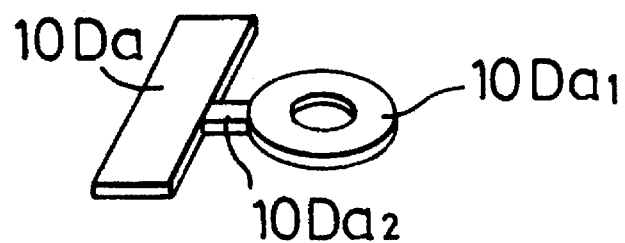
Figure 5B:
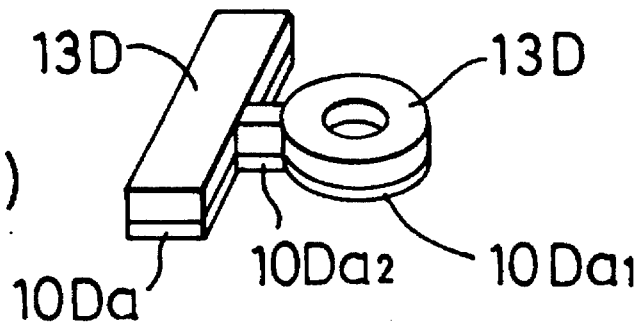
Figure 5C:
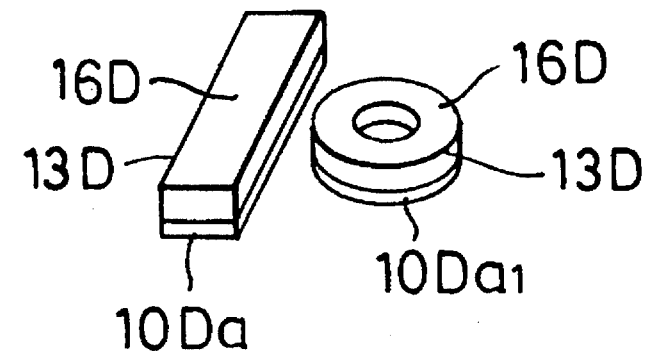

Here, in an event where the metal film 10Ca of the circuit-printing parts 11C involves an independent metal film provided independent of the metal film 10Ca connected to the feeding electrodes, it is impossible to feed to such independent metal film any current for the electroplating. In the present instance, therefore, the laser irradiation is made for providing, as shown in FIG. 5(a), a feeding metal film 10Da2 as a bridge circuit between the metal film 10Da connected to the feeding electrodes and the independent metal film 10Da1, the electroplating is performed while feeding the current from the metal film 10Da, through the feeding metal film 10Da2 to the independent metal film 10Da1, and the independent metal film 10Da1 can be also provided with the electro-plated layer 13D together with the metal film 10Da, as in FIG. 5(b). By removing the feeding metal film 10Da2 as well as the electro-plated layer 16D provided thereon through a drilling or the like mechanical means, it it enabled to render the circuit element 13D formed on the independent metal film 10Da1 to be independent of the circuit element 13D formed on the metal film 10Da connected to the electrodes.

Figure 6A:
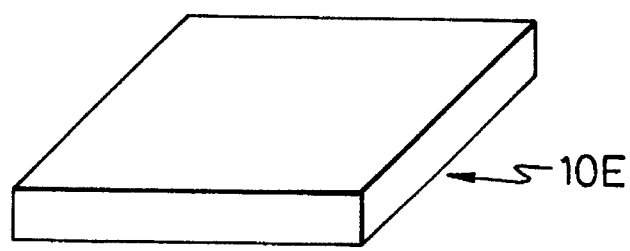
Figure 6B:
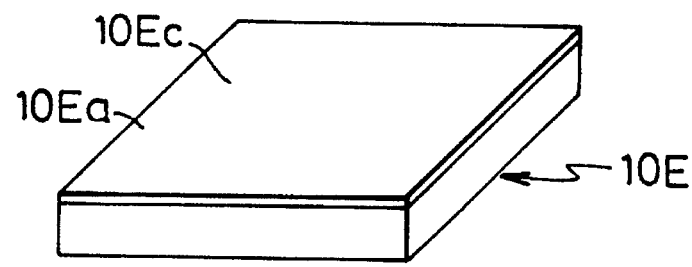

FIGS. 6(a)–6(e) show another embodiment of the present invention, in which the same insulating substrate 10E as that in the embodiment of FIGS. 1(a)–1(e) and formed in the planar shape as seen in FIG. 6(a) can be employed, while any other substrate of three dimensional cubiform may also be employed. In this case, the surface of the insulating substrate 10E is plasma-treated for being roughened to be minutely undulated, and thereafter the metal film 10Ea is provided as the plating ground layer on the surface of the insulating substrate 10E in the same manner as in the embodiment of FIGS. 4(a)–4(e), to be a thin film of Cu, Ni, Pd, Cr, Au or the like and about 0.1 to 2 μ m thick, as shown in FIG. 6(b).

Figure 6C:
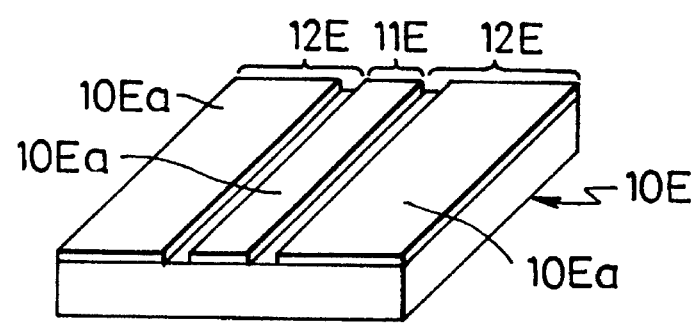
Figure 6D:
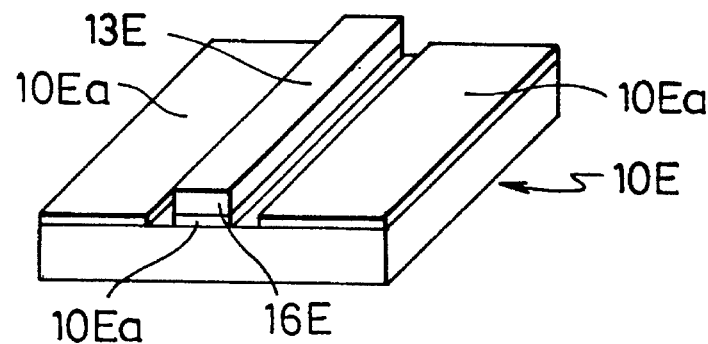

In this case, in the same manner as in the embodiment of FIGS. 1(a)–1(e), the laser or the like electromagnetic wave is irradiated to partly remove the thin metal film 10Ea where the laser has been irradiated. For the laser, as in the case of FIGS. 1(a)–1(e), it is possible to employ the Q switch YAG laser or the like, and the arrangement is so made that the laser is irradiated along the boundary edge line of the non-circuit parts 12E with respect to the circuit-printing parts 11E while moving the laser on the surface of the insulating substrate 10E, as operated by means of the galvanomirror formed with the galvanometer employed. Accordingly, as shown in FIG. 6(c), the metal film 10Ea at the non-circuit parts 12E and at the laser-irradiated boundary edge portion with respect to the circuit-printing parts 11E is removed, while the metal film 10Ea as the plating ground layer and at the non-irradiated parts is maintained without being removed, together with the metal film 10Ea at the circuit-printing parts 11E. The laser irradiation energy should preferably be about 10 to 300 μJ/pulse, for example, similarly to the embodiment of FIGS. 1(a)–1(e), and the arrangement may be so made as to simultaneously remove the surface portion of the insulating substrate with the removal of the metal film 10Ea. Further, similarly to the case of the embodiment of FIGS. 1(a)–1(e), the laser should preferably be irradiated just once along the non-circuit parts 12E in the event where the width of the non-circuit parts 12E is equal to the spot diameter of the irradiated laser.

After the irradiation of the laser along the boundary edge line of the non-circuit parts 12E with respect to the circuit-printing parts 11E on the surface of the insulating substrate 10E, as has been described, the insulating substrate 10E is immersed in the electroplating bath while feeding the current to the metal film 10Ea at the circuit-printing parts 11E connected to the negative side of the feeding electrodes, similarly to the embodiment of FIGS. 4(a)–4(d), and the electro-plated layer 16E of copper or the like is separated out in about 10 μ m thick on the metal film 10Ea at the circuit-printing parts 11E so that the pattern of the circuit elements 13E can be formed. As no current is fed to the metal film 10Ea remained at the non-circuit parts 12E, there is provided no electro-plated layer on such metal film 10Ea remained.

Thereafter, the insulating substrate 10E is subjected to a light etching through a dipping for a short time or the like in an etching solution, and the thin metal film 10Ea remained at the non-circuit parts 12E is removed. At this time, the circuit elements 13E which have been formed with the electro-plated layer 16E provided to be thick on the metal film 10Ea at the circuit-printing parts 11E should never be erased by the light etching (see FIG. 6(d)).

Figure 6E:
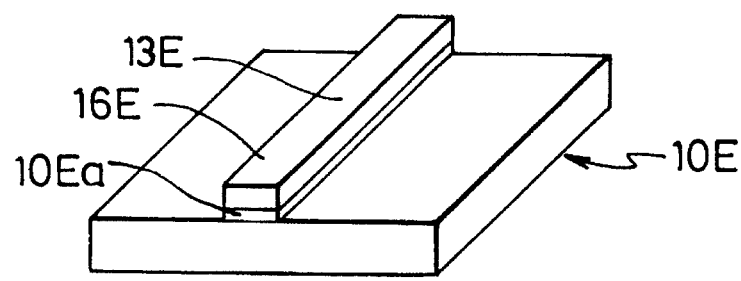
Figure 7A:
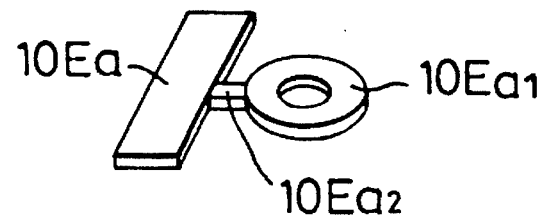
Figure 7B:
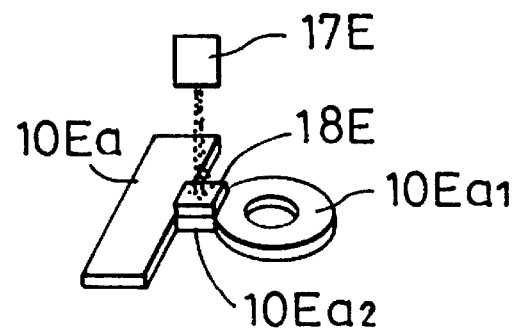
Figure 7C:
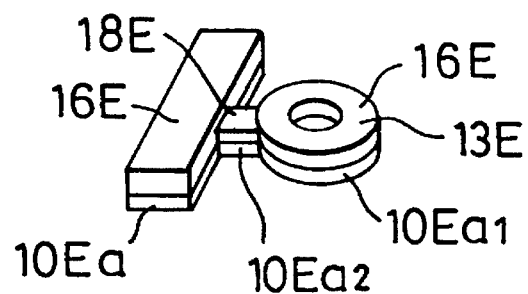
Figure 7D:
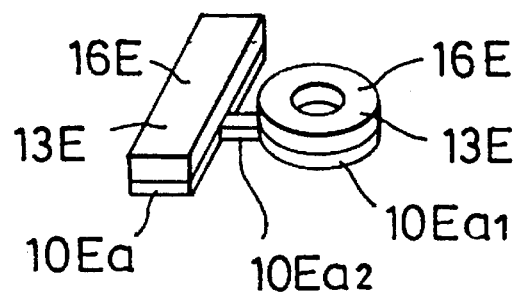
Figure 7E:
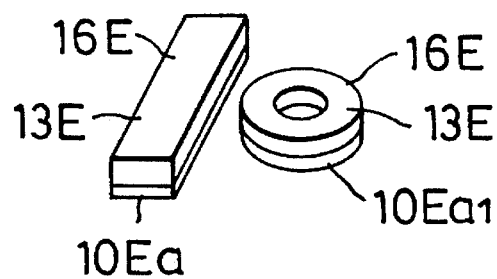

After the circuit formation through the electroplating on the metal film 10Ea at the circuit-printing parts 11E as well as the light etching for removal of the metal film 10Ea at the non-circuit parts 12E, the printed circuit board can be finished by applying the solder resist, Ni plating, Au plating or the like, as occasion demands (see FIG. 6(e)). After performing the electroplating as in the above, for example, it will be possible to paint the solder resist, to expose required parts for the Ni or Au plating through a patterning, and to perform the Ni or Au plating through the electroless plating. In the manufacture of the printed circuit board as in the above manner, the laser irradiation is executed only along the boundary edge line of the non-circuit parts 12E with respect to the circuit-printing parts 11E, the laser is not required to perform any scanning for irradiation over the whole surface of the non-circuit parts 12E, and it is made possible to shorten the treating time for the laser irradiation similarly to the case of the embodiment of FIGS. 1(a)–1(e). Further, as the plating for the circuit formation is performed only at the circuit-printing parts 11E required for forming the circuit 13E and not at the non-circuit parts 12E, and any wasting part of the plating material such as the plating metal can be reduced to be economically advantageous, similarly to the case of the embodiment of FIGS. 4(a)–4(d). Further, as the metal film 10Ea remained at the non-circuit parts 12E is removed by means of the light etching, the insulation properties of the circuit 13E formed at the circuit-printing parts 11E can be improved.

In the event where, in the embodiment of FIGS. 6(a)–6(e), the independent metal film 10Ea1 is present as provided independently of the metal film 10Ea connected to the feeding electrodes, it is possible to provide the electro-plated layer 16E on the independent metal film 10Ea1 in such manner as in an embodiment of FIGS. 7(a)–7(e). That is, the laser is first irradiated for providing a power feeding metal film 10Ea2 between the metal film 10Ea connected to the power feeding electrode and the independent metal film 10Ea1 as in FIG. 7(a), a plating resist 18E is applied with an ink jet printer 17E or a dispenser on the power feeding metal film 10Ea2, to coat the surface of the power feeding metal film 10Ea2 as in FIG. 7(b). Further, by carrying out the electroplating by feeding the power from the metal film 10Ea through the power feeding metal film 10Ea2 to the independent metal film 10Ea1, it is possible to provide the electro-plated layer 16E also on the independent metal film 10Ea2 along with the metal film 10Ea as in FIG. 7(c). Next, the resist 18E provided on the power feeding metal film 10Ea2 is peeled off to expose the power feeding metal film 10Ea2 as in FIG. 7(d), thereafter the power feeding metal film 10Ea2 is dissolved and removed at the foregoing light etching step, and thereby the circuit element 13E formed on the independent metal film 10Ea1 can be made independent of the circuit element 13E on the metal film 10Ea.

Further, in forming the circuit 13B–13E as in the respective embodiments of FIGS. 3(a)–3(g), FIGS. 4(a)–4(d), FIGS. 5(a)–5(e), FIGS. 6(a)–6(e) and FIGS. 7(a)–7(e) by forming the metal film 10Ba–10Ea on the surface of the insulating substrate 10B–10E, irradiating the laser, and performing the electroplating for providing the electro-plated layer 16B–16E on the metal film 10Ba–10Ea, there arises a risk that, in an event where the metal of the metal film 10Ba–10Ea is different from the metal of the electro-plated layer 16B–16E, the electroplating bath is contaminated by a dissolving of the metal film 10Ba–10Ea by the electroplating bath upon carrying out the electroplating by dipping the insulating substrate 10B–10E in the bath. In this event, it is preferable that the metal film 10Ba–10Ea and electro-plated layer 16B–16E are formed by the same metal. For example, the metal film 10Ba–10Ea thin to be about 0.1 to 2 μm thick is provided on the surface of the insulating substrate 10B–10E by means of the sputtering of Cu or the like as in FIG. 3(b), FIG. 4(b) or FIG. 6(b), the laser is irradiated to the boundary edge zone of the non-circuit parts 12B–12E with respect to the circuit-printing parts 11B–11E on the surface of the insulating substrate 10B–10E, thereafter the insulating substrate 10B–10E is dipped in the copper electroplating bath while feeding the power to the metal film 10Ba–10Ea connected to the negative side of the power feeding electrodes as in FIG. 3(e), FIG. 4(d) or FIG. 6(d), and the electro-plated copper layer 16B–16E can be separated out on the metal film 10Ba–10Ea to be about 10 μm thick, so as to be able to form the patterned circuit 13B–13E.

Since, in carrying out the electroplating by dipping the insulating substrate 10B–10E in the electroplating bath, the metal of the metal film 10Ba–10Ea on the insulating substrate 10B–10E is made the same as that solved in the electroplating bath, there occurs no contamination of the electroplating bath by any different metal even when the metal film 10Ba–10Ea at the non-circuit parts 12B–12E is dissolved into the bath, but rather the metal dissolved from the metal film 10Ba–10Ea at the non-circuit parts 12B–12E is to supplement the metal of the electroplating, and it is possible to improve the electroplating in the economic properties. Further, in performing such electroplating, it is enabled to dissolve and remove the metal film 10Ba–10Ea at the non-circuit parts 12B–12E without requiring such light etching as in the embodiment of FIGS. 6(a)–6(e) by dipping the insulating substrate 10B–10E in the electroplating bath while feeding the power through the positive electrode to the metal film 10Ba–10Ea at the non-circuit parts 12B–12E simultaneously with the power feeding through the negative electrode to the metal film 10Ba–10Ea at the circuit-printing parts 11B–11E, so that, at the same time of the separating out of the electro-plated layer 16B–16E due to the power feed from the negative electrode to the metal film 10Ba–10Ea at the circuit-printing parts 11B–11E, the metal film 10Ba–10Ea at the non-circuit parts 12B–12E can be positively dissolved into the electroplating bath as the result of the power feeding from the positive electrode.

In irradiating the laser along the boundary edge line of the non-circuit parts 12B–12E with respect to the circuit-printing parts 11B–11E on the surface of the insulating substrate 10B–10E as in the foregoing embodiments, it is possible to carry out the laser irradiation with the irradiated beam diameter of the laser made variable. That is, the irradiated beam diameter of the laser made large allows a wider area to be irradiated at a higher speed as the laser beam can be irradiated on a larger area but the irradiation not to be made while achieving any fine drawing action, whereas the irradiated beam diameter made small allows the laser irradiation to achieve the fine drawing action but the wider area not to be irradiated at a higher speed due to the irradiation area made smaller. Thus the irradiated laser beam diameter made constant involves both merits and demerits, but it is made possible to attain the merits only by rendering the irradiated laser beam diameter to be variable during the scanning operation of the laser.

Figure 8:
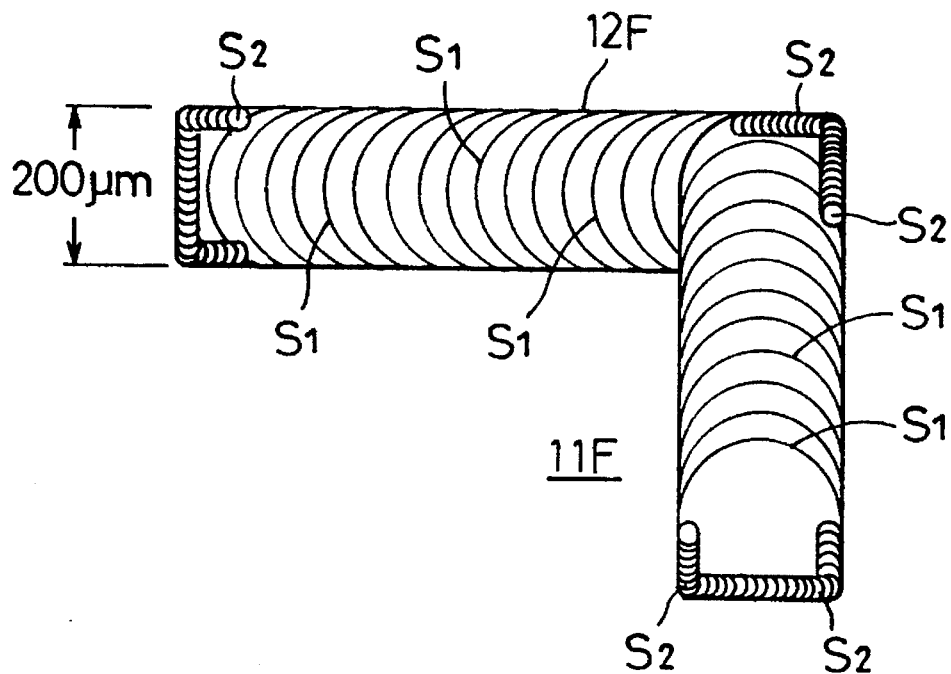
FIGS. 8 and 9 are explanatory views for other embodiments of the present invention in which irradiating beams of different diameters are employed, respectively.
Figure 9:
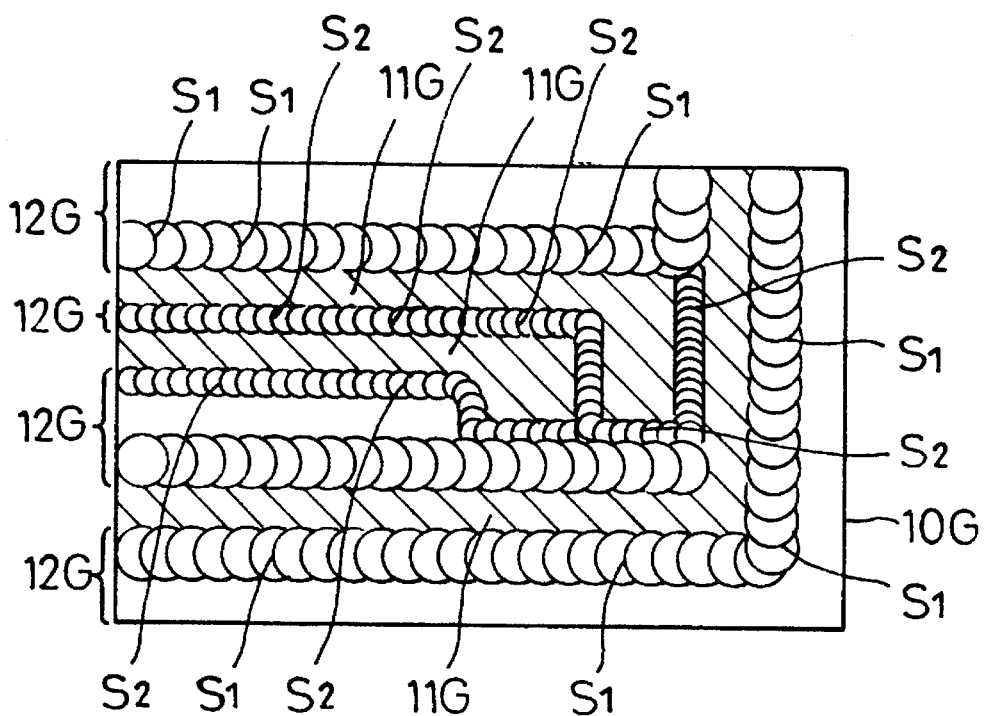

FIG. 8 shows an example of the use of the irradiated laser beam diameter made variable for different purposes. Thus, in an event where the circuit pattern has a standardized width at lines and spaces of 200 μm/200 μm, i.e., the circuit-printing parts 11F are respectively 200 μm in the width and the non-circuit parts 12F between adjacent ones of the circuit-printing parts 11F are also respectively 200 μm in the width, the irradiated laser beam diameter is controlled to have a spot radius of 100 μm, this laser beam is moved along the center line of each non-circuit part 12F (the larger diametered spot of the irradiation beam being shown in FIG. 8 with circles $S_1$) so that the entire non-circuit part 12F can be irradiated by the single irradiation of the large diametered laser beam, and the laser irradiation can be performed at the high speed drawing action. In carrying out the laser irradiation with respect to the non-circuit part 12F at a small curve of a radius less than 100 μm or at a narrow section between pins or the like, the irradiation can be performed while attaining the fine drawing action by controlling the laser beam to be of a smaller diameter (as shown in FIG. 8 by smaller diametered circles $S_2$). In varying the irradiated laser beam diameter for the different purposes as in the above, the arrangement may be made for the operation on the basis of later described CAD/CAM information. Another embodiment shown in FIG. 9 is an example of the laser irradiation with the irradiated laser beam diameter varied for the different use, in forming the circuit-printing parts 11G and non-circuit parts 12G on the insulating substrate 10G, in which the irradiation of the high speed drawing action is made by the larger diametered beam (spot $S_1$) and the irradiation for the drawing with respect to details is made by the smaller diametered beam (spot $S_2$).

Figure 10A:
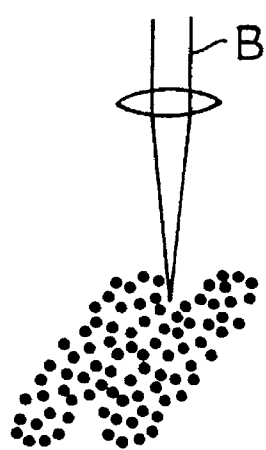
FIGS. 10(a) and 10(b) are schematic explanatory views for a beam defocusing control in the embodiments shown in FIGS. 8 and 9.
Figure 10B:
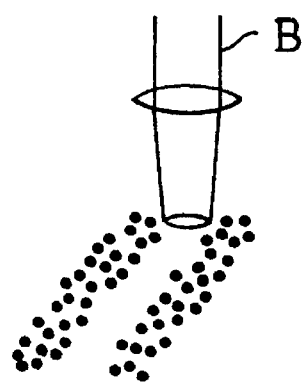
Figure 11:
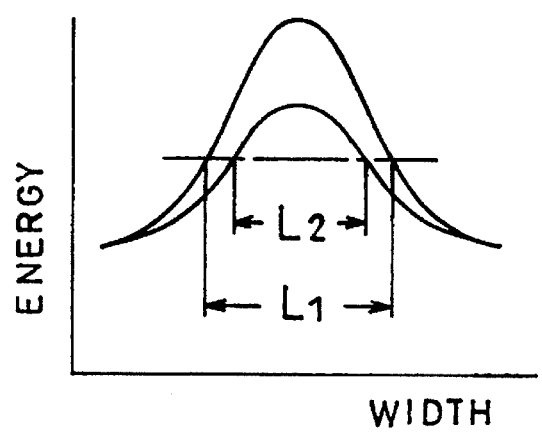
FIGS. 11 and 12 are graphs showing examples of diameter controlling of the laser beam as the electromagnetic wave in the embodiments shown in FIGS. 8 and 9.
Figure 12:
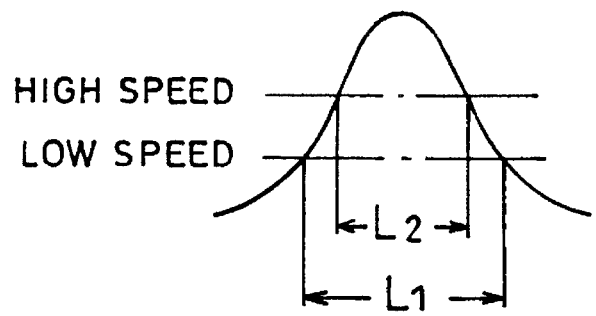

The control of the irradiated laser beam diameter as in the above can be attained by, for example, controlling the defocusing amount. That is, when the focus of the laser beam B is placed to coincide with the irradiation surface to render the defocusing amount to be zero as in FIG. 10(a), the irradiated laser beam diameter can be minimized (in which event the moving velocity of the irradiated beam is made higher), while the focus of the laser beam B deviated from the irradiation surface to render the defocusing amount to be larger as in FIG. 10(b) causes the irradiated laser beam diameter to be larger (in which event the moving velocity of the irradiated beam is made lower). Further, as in FIG. 11, the irradiated laser beam diameter can be regulated to be $L_1$ and $L_2$, by controlling the oscillating energy of the laser of a beam mode having a gradual intensity distribution. Further, as in FIG. 12, the irradiated laser beam diameter can be regulated to be $L_1$ and $L_2$, also by varying the scanning speed of the laser of the beam mode having the gradual intensity distribution, or by varying the irradiation time. The regulation of the irradiated laser beam diameter is of course not limited to these measures, and any optional measures may be employed.

The respective foregoings measures of FIGS. 1(a)–1(e) to 8 can be practiced by controlling the irradiated laser beam diameter as referred to in the above, such that, at places where the width of the non-circuit parts 12–12F is large, the irradiation is carried out with the laser beam made to be of a wide area by controlling the irradiated laser beam diameter to be larger and, at places where the fine drawing action is required, the irradiation can be performed with the laser beam made to be of a smaller area by controlling the irradiated laser beam diameter to be smaller.

Further, in an event where the circuit designing is carried out by means of a computer aided design/computer aided manufacture (CAD/CAM) required data can be obtained by means of the width, center line or the like of the non-circuit parts on the basis of the information on the designed circuit diagram by means of the CAD/CAM. In this case, the laser irradiation can be executed while determining the position or the beam diameter of the irradiation on the basis of the obtained data. That is, as shown in a flow chart of FIG. 13, the boundary peripheral lines of the non-circuit part with respect to the circuit-printing are calculated out of the data of the center line of the circuit-printing parts 11–11F or of the width of the circuit-printing parts, and further the minimum value of the non-circuit parts is calculated out of such data. Then, the spot diameter of the irradiated laser beam is regulated to be less than the minimum value of the width of the non-circuit parts, and an offset amount corresponding to the radius of the laser spot diameter is calculated. Also, a laser-irradiation center line which is offset from the boundary edge line of the and non-circuit parts to the side of the non-circuit part is calculated, the sequency of the irradiation is determined so as to render ceasing time of the laser irradiation to be the minimum as well as the total length of positional removing accompanying no laser irradiation from continuing outline to another outline for the irradiation to be the minimum, these data are input into the galvanomirror controller and the laser irradiation can be controlled.

In the event where the width of the non-circuit parts 12–12F varies to be, for example, 50 to 200 μm while the possible largest diameter of the irradiated laser beam is 200 μm, in concrete, it is possible to simultaneously irradiate the boundary edge zones on both sides of the non-circuit parts just through the single irradiation, by executing the laser irradiation while bringing the irradiated laser beam diameter in conformity to the width of the non-circuit parts, and also regulating the center of the irradiated laser beam so as to coincide with the center line of the non-circuit parts, on the ground of the CAD/CAM data. When the width of the non-circuit parts is 300 μm, for example, to be above the largest value of the irradiated laser beam diameter, then the irradiated laser beam diameter is regulated to be 150 μm, for example, so that the laser irradiation can be performed for two times along the boundary edge zones on both sides of the non-circuit parts. The irradiation energy of the laser should preferably be set to be, for example, in a range of 0.05 to 1mJ/cm².

The respective measures of FIGS. 1(a)–1(e) to 8 can be practiced with the irradiated laser beam diameter being regulated on the base of the information of the designed circuit diagram by means of CAD/CAM as in the foregoing, and the control of the irradiated laser beam diameter can be executed by means of the defocusing control, intensity control, velocity or irradiating time control or the like. As the irradiating position or the spot diameter of the laser or the like electromagnetic wave is determined in view of the CAD/CAM information, as in the above, it is enabled to prepare the operational data for the laser or the like in a short time, and to shorten the required working time.

Figure 13:
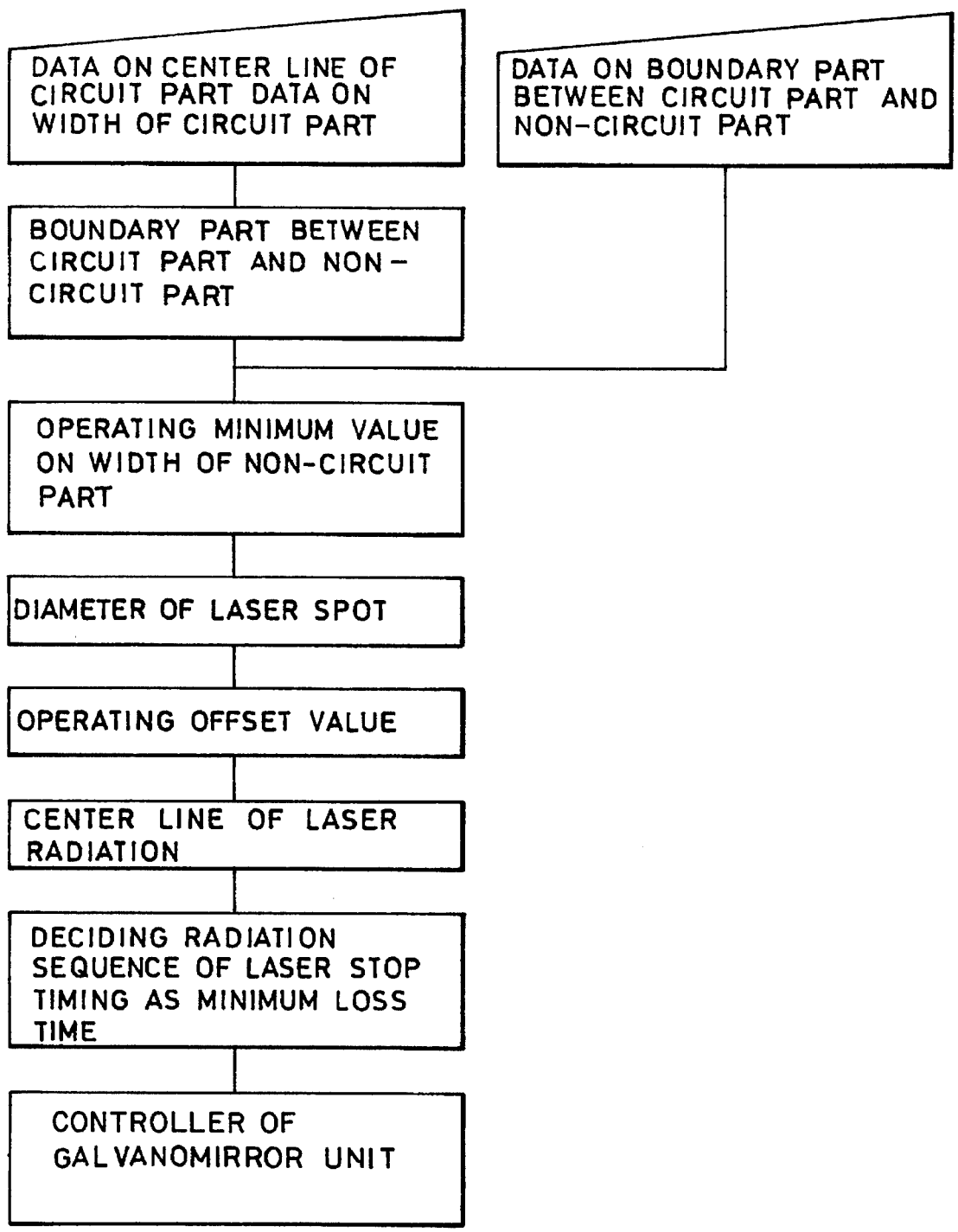
FIG. 13 is a flow chart showing the sequence of controlling the laser beam employed as the electromagnetic wave in the respective foregoing embodiments according to the present invention.
Figure 14:
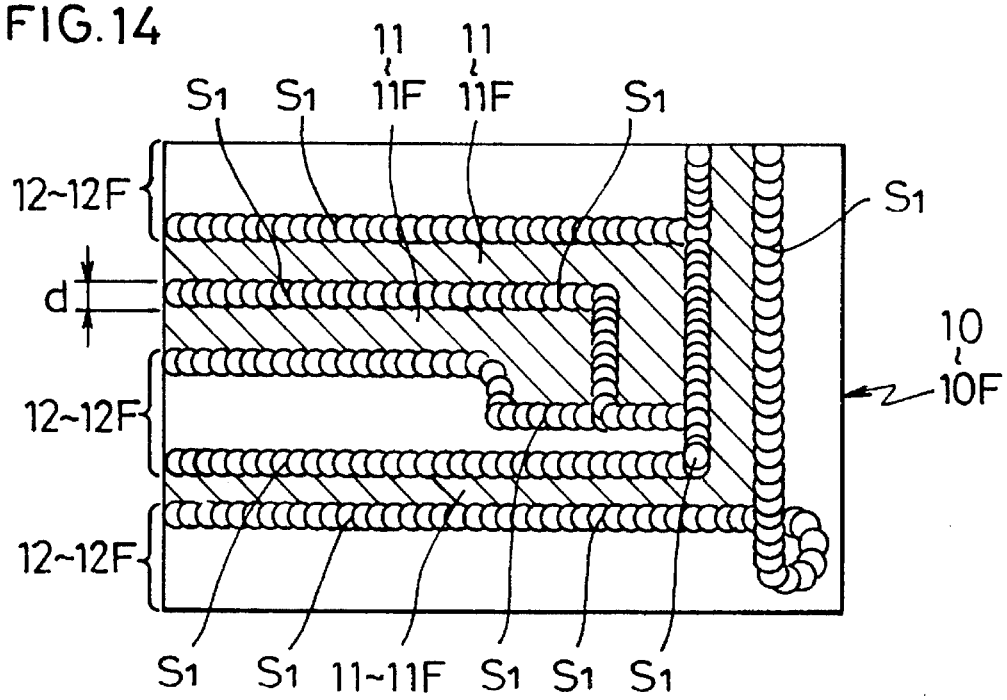
FIG. 14 is an explanatory view for another embodiment of the present invention employing another irradiating aspect of the laser beam as the electromagnetic wave.

Further, in performing the irradiation while determining the irradiated laser beam diameter as in the flow chart of FIG. 13 on the ground of the CAD/CAM information, the circuit pattern formation can be easily realized even in the case of a fine circuit having a narrow pattern intervals between the circuit elements 13–13F, by irradiating the laser as in FIG. 14 with the spot diameter of the irradiated laser beam regulated to be the minimum value of the width of the non-circuit parts 12–12F (the irradiated beam spot being shown in FIG. 14 by circles $S_1$).

In an event where the laser moving operation (scanning) is carried out with the galvanomirror in irradiating the laser along the boundary edge lines of the non-circuit parts 12–12F with respect to the circuit-printing parts 11–11F on the surface of the insulating substrate 10–10F as in the foregoing respective embodiments, there arises a problem that the irradiation is caused to be overshot due to the inertia of the galvanomirror at corner portions of the circuit parts while the laser scanning is performed at a high speed. While the arrangement is so made that no overshoot due to the inertia takes place by rendering the laser scanning velocity slower at the corner portions of the circuit-printing parts, but the laser scanning velocity made to be delayed causes the laser energy concentrated to the corner portions to render the insulating substrate to be damaged. For this reason, it has been also practiced that the irradiation is temporarily stopped at the corner portions in the circuit-printing parts, but this might cause the irradiation treating time to be prolonged.

Figure 15A:
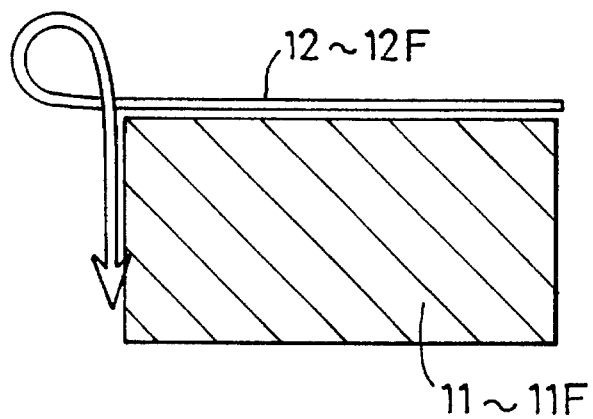
FIGS. 15(a) and 15(b) are explanatory views for another embodiment of the present invention in which another irradiating aspect of the laser beam is employed.
Figure 15B:
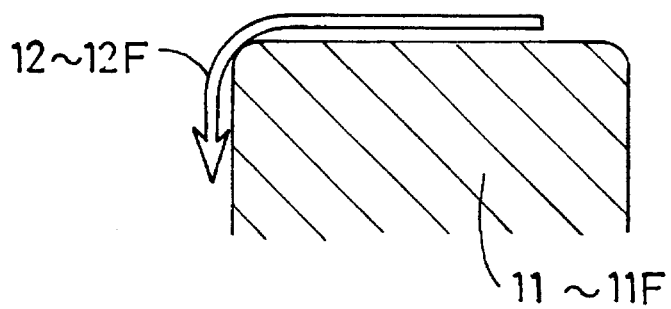

In this event, it is desirable to have the non-circuit parts 12–12F scanned by the laser beam made to draw a curve at the corner portion of the circuit-printing parts 11–11F by means of the galvanomirror or the like. In performing the irradiation with the laser made to scan along the boundary edge line of the non-circuit parts with respect to the circuit-printing parts, therefore, there may be taken measures for finish the corner portions of the circuit-printing parts, so as to be square as shown in FIG. 15(a) by causing the laser to change the direction while drawing a curve to turn around once within the non-circuit part upon passing through the corner portion of the circuit-printing part and again to scan along the boundary edge line with respect to the circuit-printing part, or so as to have the corner portion of the circuit-printing part rounded as shown in FIG. 15(b) by causing the laser to draw a curve at the corner portion of the circuit-printing part, so that the scanning can be performed at a speed kept constant.

As referred to in the above, the respective measures of FIGS. 1(a)–1(e) through 7(a)–7(e) can be practiced with the laser being shifted to draw the curve at the corner portion of the circuit-printing part, and the required treating time for the irradiation can be shortened with the laser shifted at a high speed without giving to the corner portion of the circuit-printing part any damage at all. The radius of the curve is substantially equal to a distance required for acceleration and deceleration of the galvanomirror, which is 300 μm, for example. At this time, the radius of the curvature or the like is to be set on the basis of the information of the designed circuit diagram according to the CAD/CAM.

Figure 16:
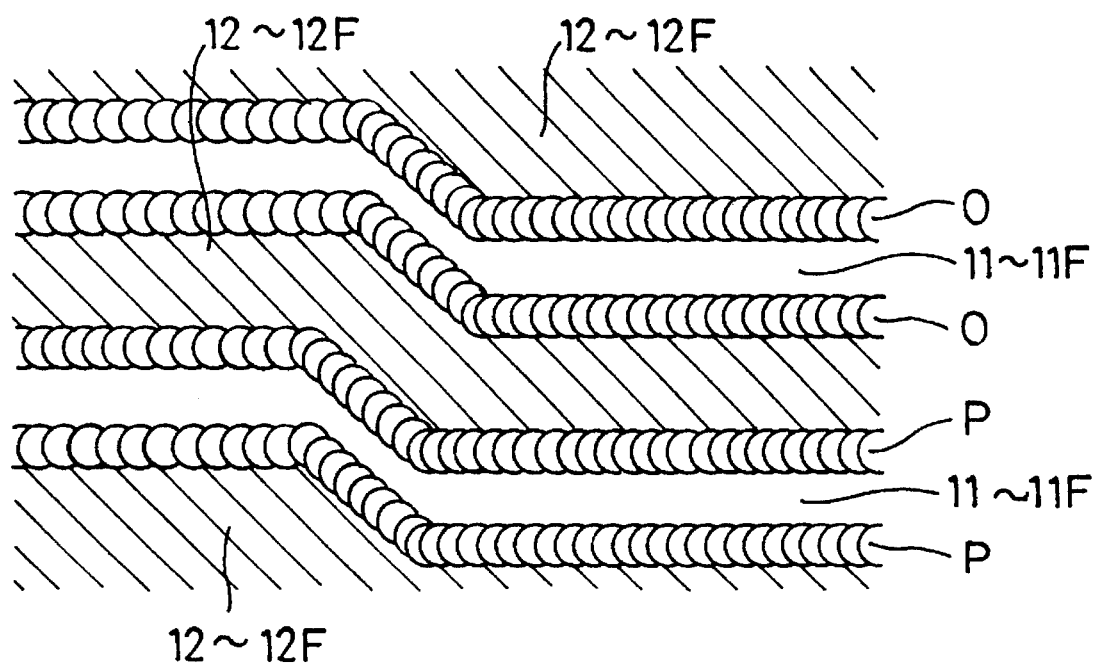
FIG. 16 is an explanatory view for another embodiment of the present invention, employing another irradiating aspect of the laser beam.

Further, in performing the laser irradiation along many of the boundary edge lines of the non-circuit parts with respect to the circuit-printing parts on the surface of the insulating substrate 10–10F, it is caused to require a long time for the irradiation treatment when every boundary edge line is irradiated by the laser one by one. Accordingly, at places where the adjacent boundary edge lines between the non-circuit parts 12–12F and the circuit-printing parts 11–11F are mutually parallel, it is enabled to simultaneously irradiate a plurality of positions by dividing the laser into a plurality of spots and shifting the spots respectively separated from each other to be mutually parallel. FIG. 16 shows an example thereof, in which the arrangement is so made that the laser irradiation to the boundary edge zones of the non-circuit parts on both sides of the respective circuit-printing parts by dividing the laser beam into two spots which are irradiated while being shifted in mutually parallel relationship along the boundaries on both sides of each circuit-printing part (in FIG. 16 the laser is made to be dual spots for the simultaneous irradiation onto two adjacent boundaries denoted by a symbol "O" or "P").

In executing the shift of the laser irradiation with the X, Y galvanomirror operated, such irradiation can be attained by inserting a double focus lens system between the laser oscillator and the galvanomirror for shaping the laser into two spots, which are regulated to have a space responsive to a space between the adjacent parallel boundary lines of the circuit-printing part. Further, instead of such simultaneous irradiation of the two spots onto the both sides of the circuit-printing part as in the above, it is also possible to have both side contours of the non-circuit part irradiated simultaneously, or to have two parallel contours with one or more circuit-printing or non-circuit part put between them.

Figure 17:
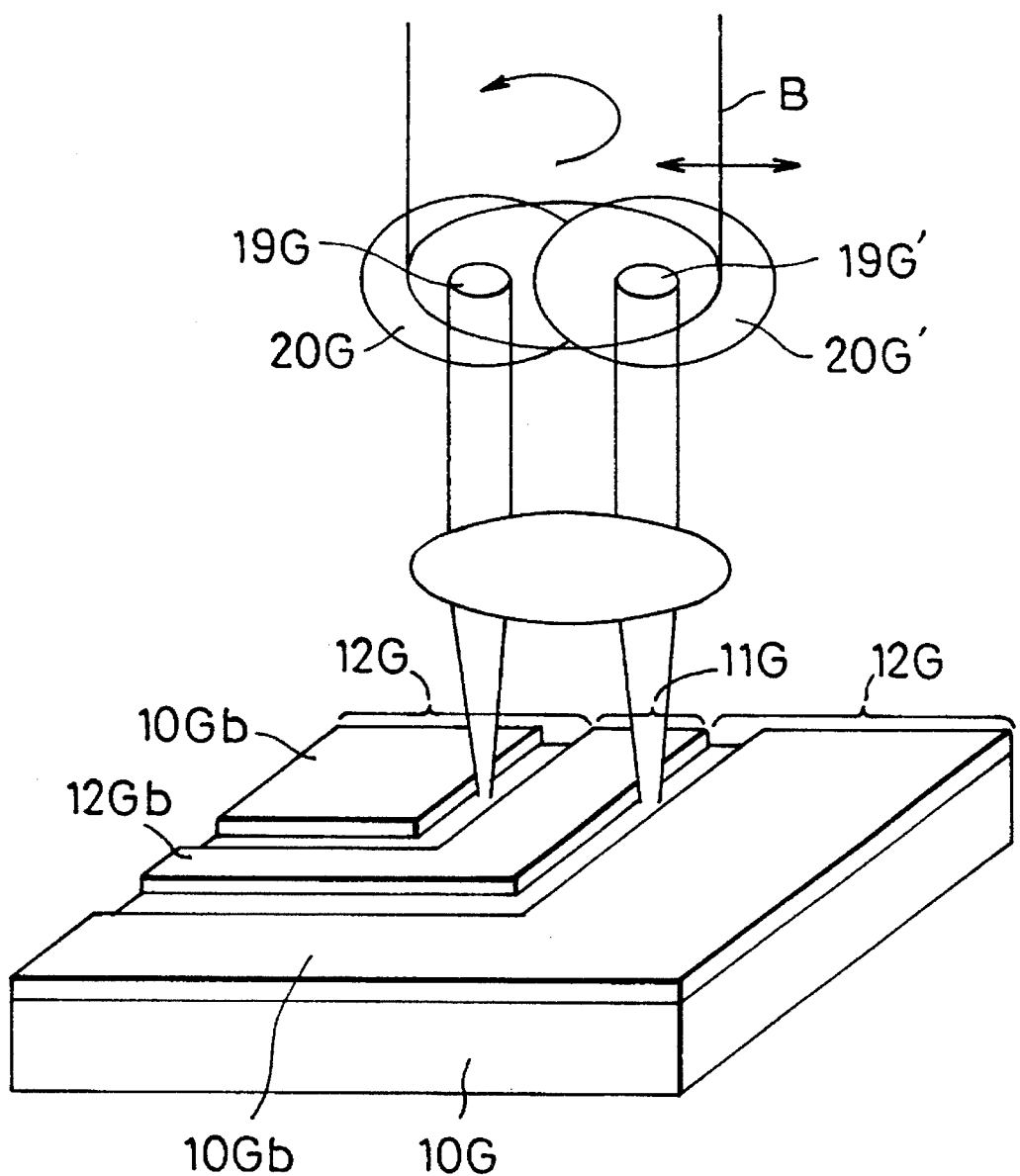
FIG. 17 is an explanatory view for another embodiment of the present invention in which the laser beam is employed in two spots irradiation.

In FIG. 17 showing an example of the laser shaped into the two spots, two masks 20G and 20G' each having a pin hole or slit 19G or 19G' are inserted in a light path of the laser beam B, for dividing the beam into the two spots respectively passing through the pin hole 19G or 19G' of each mask 20G or 20G'. In this case, relative positional relationship of the masks 20G and 20G' is varied to regulate the space between the pin holes 19G and 19G', so that the space between the two spots of the laser can be set, and a directional change of the scanning laser can be attained by integrally rotating the two masks 20G and 20G'.

Figure 18:
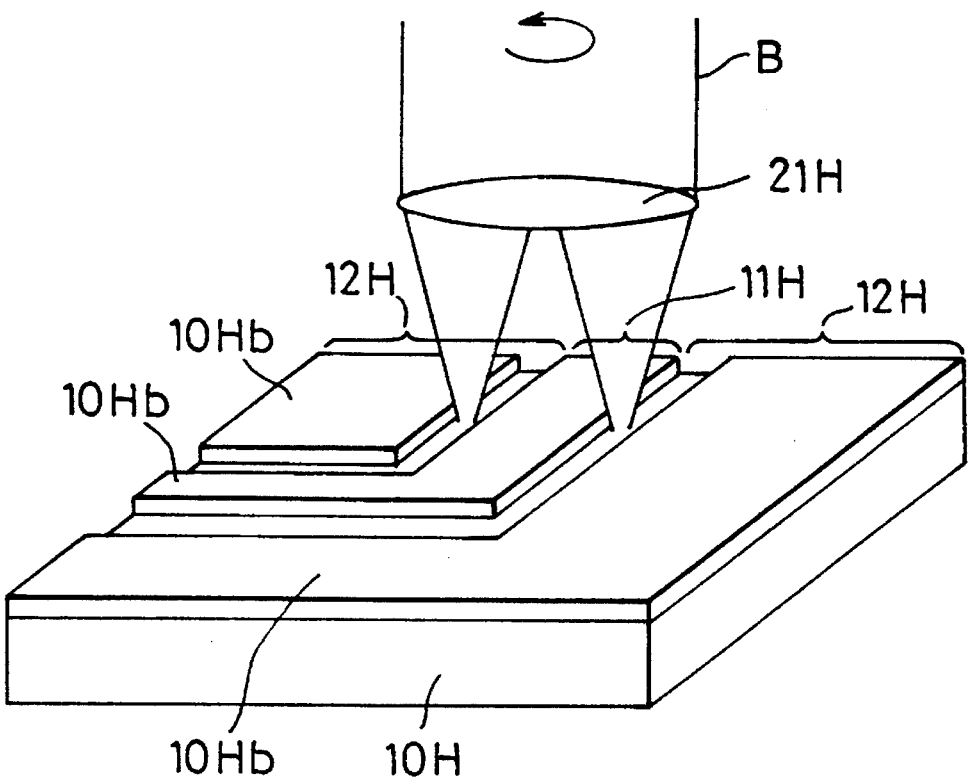
FIG. 18 is an explanatory view for another embodiment of the present invention in which the laser beam is irradiated through a double focus lens.

In another embodiment of FIG. 18, the arrangement is so made that the laser beam is divided into two focused spots by means of a double focus lens 21H inserted in the light path of the laser beam B, in which event the change of direction in which the laser is made to scan can be attained by rotating the double focus lens 21H.

Figure 19:
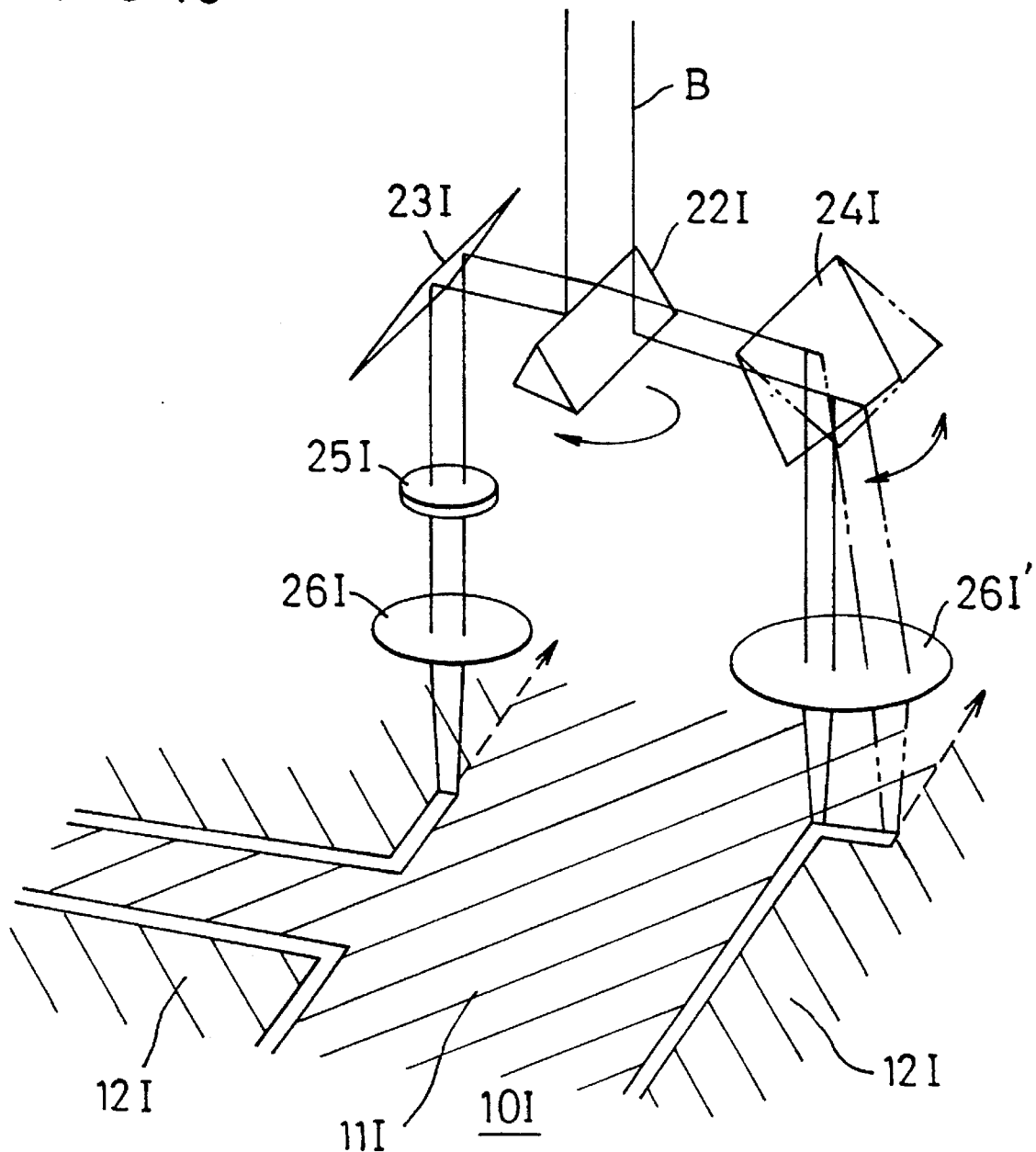
FIG. 19 is an explanatory view for another embodiment of the present invention in which two divided spot irradiation from a single laser beam is employed.

FIG. 19 shows another embodiment for shaping the laser into two spots, in which the light path of the laser beam B is divided into two by means of a prism 22I inserted in the light path, movable mirrors 23I and 24I are inserted respectively in each of the divided light paths for free regulation of the angle of inclination, and further an AO switch 25I or lenses 26I and 26I' are inserted in respective light paths reflected from the mirrors. The prism 22I, movable mirrors 23I and 24I, AO switch 25I and lenses 26I and 26I' are rotated horizontally in integral manner as a whole. In this case, the laser beam B is divided into two by the prism 22I, the two divided light paths are respectively reflected by the movable mirrors 23I and 24I, and the reflected light paths are irradiated through the AO switch 25I and lens 26I or only through the lens 26I' onto the surface of the insulating substrate 10I. Thus, the laser can be irradiated simultaneously at two positions as divided into two parallel spots, and these two spots are simultaneously changed in the direction for the irradiation at places where the parallel lines vary the direction. Further, in an event where one of the parallel lines is unnecessary at such places where the circuit-printing parts 11I intersect each other, an end part of the circuit-printing part 11I and the like, it is enabled to have one 24I only of the movable mirrors inclined (as shown in FIG. 19 by imaginary lines), to cause one of the divided laser beams made off or on by means of such shutter as the AO switch 25I or the like.

With the division of the laser into a plurality of spots and the radiation of these spots as moved in parallel relationship, the respective foregoing measures of FIGS. 1(a)–1(e) to 16 can be practiced, so that the irradiation of a plurality of laser beams can be realized by a single laser operation, and it is made possible to remarkably shorten the irradiation time.

Further, in irradiating the laser beam along the boundary edge line of the non-circuit parts 12I with respect to the circuit-printing parts 11I on the surface of the insulating substrate 10I as in the foregoing respective embodiments, a use of a laser in a beam mode abrupt rise in the peripheral energy distribution renders the effect of the removal of the plating ground layer by means of the laser irradiation to appear as a definite difference at the boundaries between the irradiated parts and the non-irradiated parts, that is, between the non-circuit parts 12I and the circuit-printing parts 11I, so that there occurs no blur or fade at the boundaries, and the finishing precision can be elevated at peripheral edge parts of the circuit-printing parts 11I.

Figure 20:
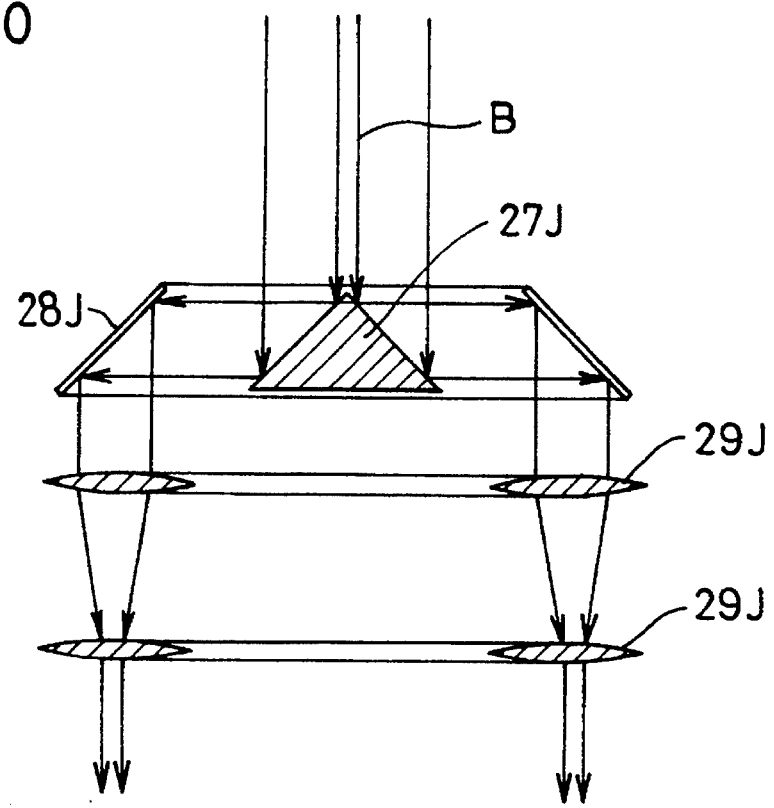
FIG. 20 is an explanatory view for another embodiment of the present invention in which another irradiating aspect of the laser beam with its peripheral energy distribution made abrupt.

FIG. 20 shows an example of measures for obtaining the laser of the beam mode abrupt in the peripheral energy distribution, in which a conical mirror 28J formed with an inner periphery of a circular truncated cone as the mirror surface is disposed around a conical prism 27J, and a plurality of cylindrical lenses 29J are disposed vertically below the conical mirror 28J. In this case, the laser beam B irradiated from the top side to the conical prism 28J is radiated radially outward to be reflected by the conical mirror 28J to be in a downward ring shape, the thus reflected annular shaped beam is constricted by the cylindrical lenses 29J, and eventually an annular beam is irradiated onto the insulating substrate 10J. The thus obtained annular beam shows to be of the beam mode showing an abrupt rise in the peripheral energy distribution.

The respective foregoing measures of FIGS. 1(a)–1(e) to 16 can be practiced with the abrupt beam mode laser in the peripheral energy distribution employed for the irradiation, the effect of the removal of the plating ground layer 10Jb by means of the laser irradiation is made to appear as the definite distinction at the boundaries between the non-circuit parts 12J and the circuit-printing parts 11J, and the finishing precision at the peripheral edge portions of the circuit-printing parts 11J can be elevated.

Figure 21A:
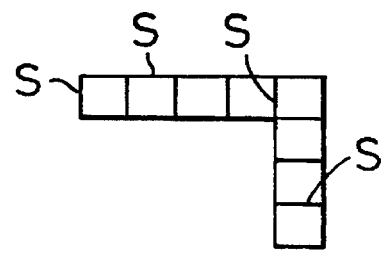
FIGS. 21(a) to 21(c) are explanatory views for other embodiments of the present invention, employing respectively different irradiating spots of the laser beam.
Figure 21B:
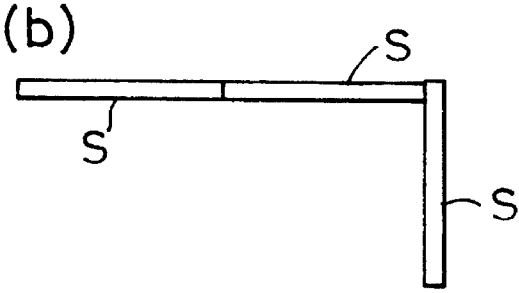
Figure 21C:
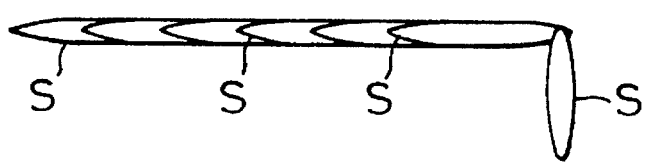

Further, in irradiating the laser or the like electromagnetic wave along the boundary edge zones of the non-circuit parts 12J with respect to the circuit-printing parts 11J on the surface of the insulating substrate 10J, as in the respective foregoing embodiments, the arrangement is so made as to form the shape of the irradiation spot of the laser or the like electromagnetic wave in any of such square shape as in FIG. 21(a), such elongated square shape as in FIG. 21(b) and such elongated elliptic shape as in FIG. 21(c) (respective spots are denoted by "S"), the laser spot S is moved, and the corner portions of the irradiated pattern can be finished in an edge shape. For shaping the irradiated spot shape of the laser or the like electromagnetic wave into the square, elongated square and elongated elliptic shape an aperture, prism, cylindrical lens or the like is employed. When the scanning is carried out with a pulsating laser, resultant irradiated parts show to be zigzag at edge portions, but zigzag extent at such edge portions can be minimized by the irradiation with the irradiating spot shaped to be such square, elongated square or elongated elliptic shape as in the above and employed for the irradiation through the scanning so that longitudinal side of the spot brought into coincidence with the boundary edge line of the non-circuit parts 12J with respect to the circuit-printing parts 11J, and the circuit-printing parts 11J can be finished to be linear at the boundary edges.

Figure 22A:
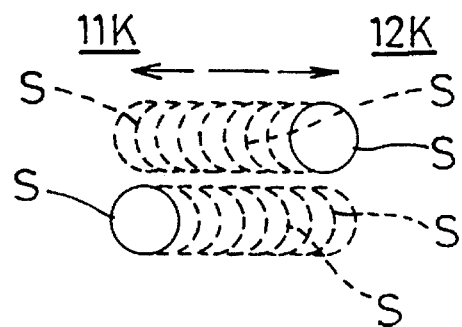
FIGS. 22(a) and 22(b) are explanatory views for other embodiments of the present invention employing further different irradiating aspects of the laser beam.
Figure 22B:

Further, in irradiating the laser or the like electromagnetic wave, the zigzag at the edge portions of the irradiated parts even with the circular spots employed can be minimized as in the case when the pulse shaped laser is used, and the boundary edges of the circuit-printing parts 11K can be finished to be linear, by shifting the irradiate beam spot S in parallel with the boundary line between the circuit-printing parts 11K and the non-circuit parts 11K as shown in FIG. 22(a), and also moving the spot along the boundary between the circuit-printing parts 11K and the non-circuit parts 12K as shown in FIG. 22(b). At this time, it is preferable to move (scan) the laser beam while causing it to be vibrated in the scanning direct to an extent that the beam position shifts by a distance 1/10 to 10 times as large as the beam spot diameter within an irradiating time of 1 pulse.

With the irradiation of the laser or the like electromagnetic wave in the irradiated spot shape made to be any of the square, elongated square and elongated elliptic shapes or as moved along the boundary between the circuit-printing parts 11K and the non-circuit parts 12K while being vibrated in parallel with the boundary line between the circuit-printing parts 11K and the non-circuit parts 12K, the respective foregoing measures of FIGS. 1(a)–1(e) to 16 can be practiced, so that the corner portions of the irradiated pattern can be finished in an edge shape, and the boundary edge of the circuit-printing parts 11K can be linearly finished with the zigzag at the edges of the irradiated parts minimized.

Figure 23:
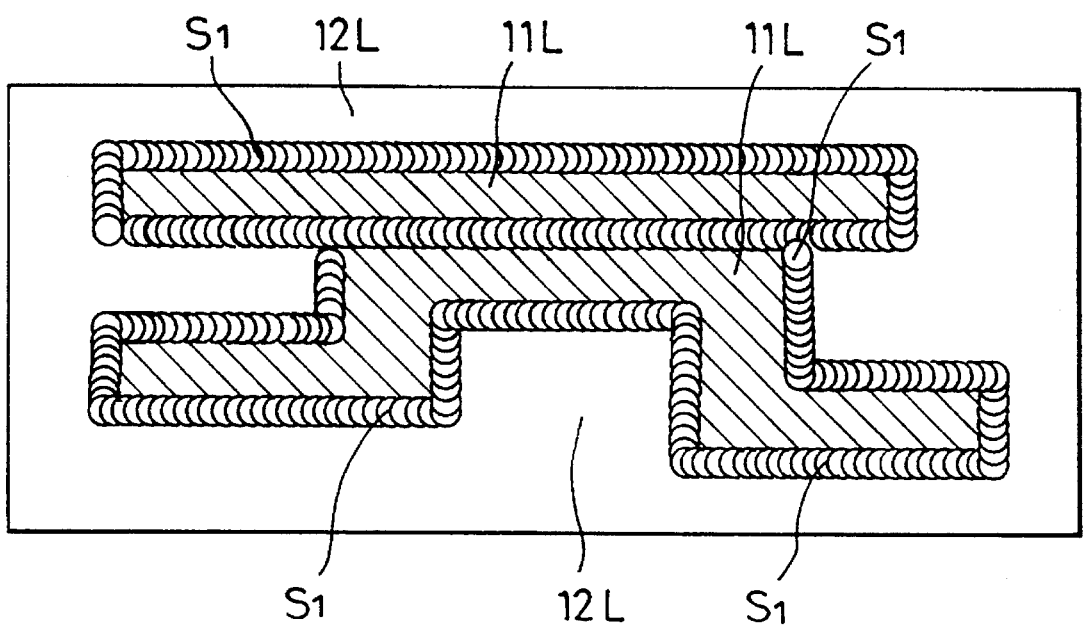
FIGS. 23 to 25 are respectively explanatory views for further embodiments according to the present invention, employing other irradiating aspects of the laser beam.
Figure 24:
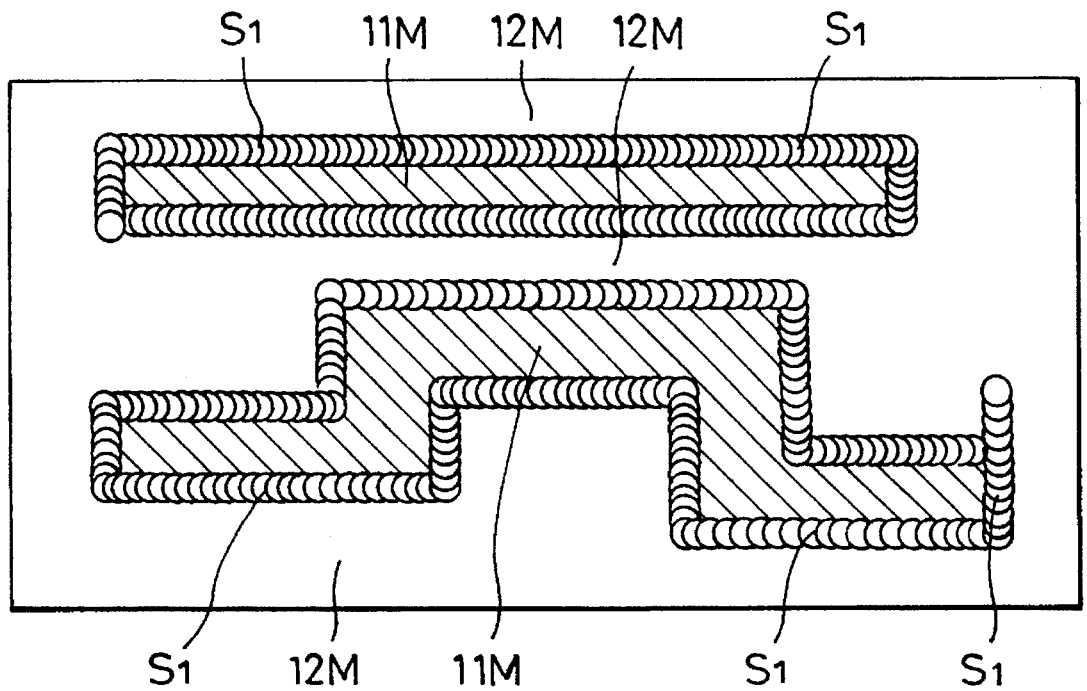
Figure 25:
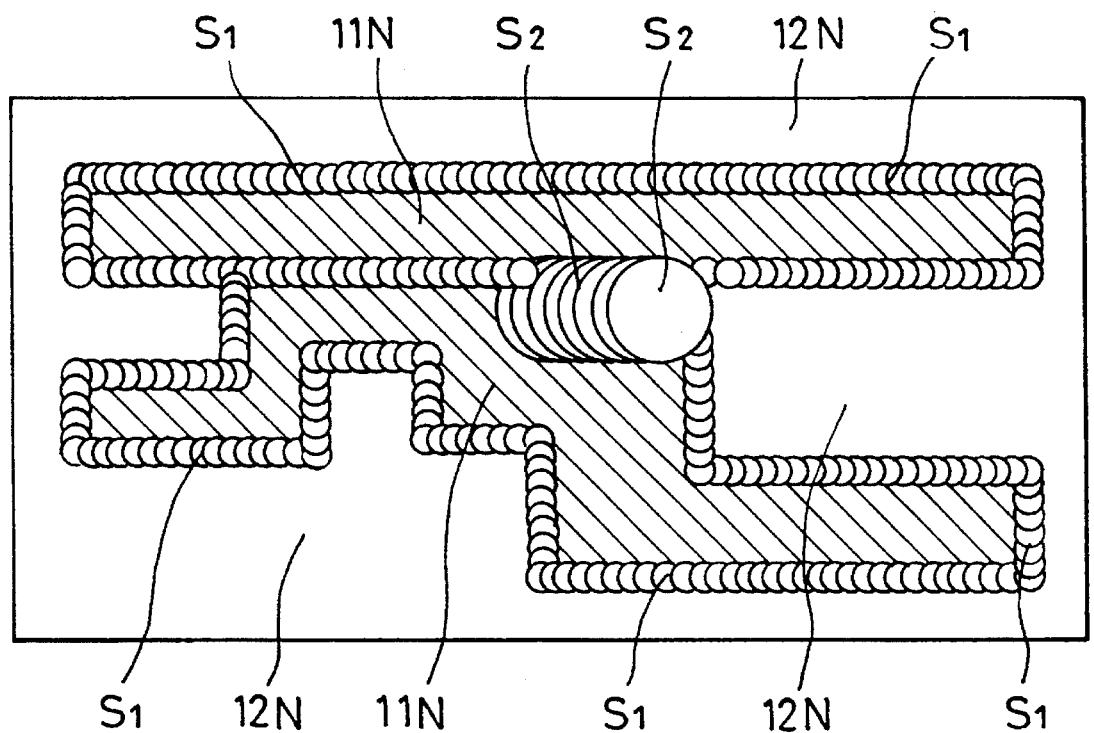

FIGS. 23 to 25 show the irradiating states of the laser at the boundary edge portions of the non-circuit parts 12L–12N with respect to the circuit-printing parts 11L–11N, in which the embodiments of FIGS. 23 and 24 show the laser irradiation with the irradiated spot $S_1$ of a smaller diameter made to scan. In another embodiment of FIG. 25, the laser is irradiated with the irradiated spot $S_1$ of the smaller diameter made to scan and additionally with the irradiated spot $S_2$ of the larger diameter also made to scan.

What is claimed is:

1. A method for manufacturing a printed circuit board in which a pattern of electric circuits is formed with a conducting material on a surface of an insulating substrate, comprising the step of:

(a) forming a plating ground layer of a metal film on said surface of the insulating substrate, said plating ground layer including a plurality of printed circuit forming parts for forming said pattern of electric circuits and a plurality of non-circuit parts for forming an insulating space between said printed circuit forming parts, (b) irradiating electromagnetic waves selected from the group consisting of coherent light, X-rays and ultraviolet rays onto said plating ground layer at a boundary edge zone of said non-circuit parts along said printed circuit forming parts on the insulating substrate to remove said plating ground layer at said boundry edge zone irradiated while allowing the plating ground layer to remain at said printed circuit forming and non-circuit parts which have not been irradiated, and (c) plating said conducting material on said plating ground layer remaining at said printed circuit forming and non-circuit parts which have not been irradiated at said step (b).

2. The method according to claim 1, wherein said plating of the conducting material on the plating ground layer at said step (c) is performed by means of an electroplating.

3. The method according to claim 2, wherein said surface treatment for removing the metal film at the boundary edge zone is performed through a moderate etching.

4. The method according to claim 2, wherein said electroplating is performed with the same metal as that of the metal film forming said plating ground layer.

5. The method according to claim 1, wherein said circuit is designed by attaining said irradiation of the electromagnetic waves on the basis of information from a computer aided design/computer aided manufacturing (CAD/CAM).

6. The method according to claim 1, wherein said irradiation of electromagnetic waves at said step (b) is carried out with a beam of the irradiation having a diameter set to be essentially equal to the minimum value of the width of said non-circuit parts.

7. The method according to claim 1, wherein said irradiation of the electromagnetic waves at said step (b) is executed with a beam of said electromagnetic waves made shiftable along a length of said boundary edge zone and variable in diameter.

8. The method according to claim 1, wherein said irradiation of the eletromagnetic waves of said step (b) is executed with a beams of said electromagnetic waves which is divided into a plurality of beam spots spaced from each other.

9. The method according to claim 1, wherein said irradiation of the electromagnetic waves at said step (b) is executed with an annular laser beam mode showing an abrupt rise in the peripheral energy distribution of said annular laser beam mode.

10. The method according to claim 1, wherein said irradiation of the electromagnetic waves at said step (b) is executed with an irradiated beam spot formed in a shaped selected from the group consisting of a square, an elongated square and an elongated ellipse.

11. The method according to claim 1, wherein said irradiation of the electromagnetic waves at said step (b) is executed with an irradiated spot made to scan along the length of said boundary edge zone while being vibrated in the direction of said scanning.

12. A method for manufacturing a printed circuit board in which a pattern of electric circuits is formed with a conducting material on a surface of an insulating substrate, comprising the steps of:

(a) providing a metal film of said conducting material on said surface of the insulating substrate, said metal film including a plurality of printed circuit forming parts for forming said pattern of electric circuits and a plurality of non-circuit parts for forming an insulating space between said printed circuit forming parts, (b) adhering a resist made removable upon irradiation of electromagnetic waves selected from the group consisting of coherent light, X-rays and ultraviolet rays onto the surface of said metal film, said resist being one selected from the group consisting of a first resist made soluble to a developer upon an exposure by means of said irradiation and a second resist evaporizable upon said irradiation, (c) irradiating the electromagnetic waves onto said resist on the metal film at a boundary edge zone of said non-circuit parts along said printed circuit forming parts on the insulating substrate to remove the resist at irradiated parts while allowing the resist to remain at said printed circuit forming parts which have not been irradiated, and (d) thereafter removing the metal film uncovered during said step c at said boundary edge zone of the non-circuit parts through a surface treatment with an etching solution.

13. A method for manufacturing a printed circuit board in which a pattern of electric circuits is formed with a conducting material on a surface of an insulating substrate, comprising the steps of:

(a) providing a metal film on said surface of the insulating substrate, said metal film including a plurality of printed circuit forming parts for forming said pattern of electric circuits and a plurality of non-circuit parts for forming an insulating space between said printed circuit forming parts, (b) adhering a resist made insoluble to a developer upon an exposure by means of irradiation of electromagnetic waves selected from the group consisting of coherent light, X-rays and ultraviolet rays to a surface of said metal film, (c) irradiating the electromagnetic waves onto said resist at a boundary edge zone of said non-circuit parts along said printed circuit forming parts on the insulating substrate to remove the resist at the non-circuit parts which have not been irradiated while allowing the resist to remain at said boundary edge zone of the non-circuit parts irradiated, (d) thereafter plating said conducting material on said surface of the metal film uncovered with the resist removed at said printed circuit forming and non-circuit parts which have not been irradiated, (e) then peeling off the resist left at the boundary edge zone, and (f) removing the metal film uncovered at the parts where the resist has been peeled off of the boundary edge zone at said step (e) through a surface treatment with an etching solution.

14. The method according to claim 13, wherein said plating of the conducting material on said metal-film at said step (d) at the printed circuit forming and non-circuit parts which have not been irradiated is performed by means of an electroplating.

* * * * *